United States Patent

Yamashita et al.

[11] Patent Number: 6,020,675
[45] Date of Patent: Feb. 1, 2000

[54] ULTRASONIC PROBE

[75] Inventors: Yohachi Yamashita, Yokohama; Senji Shimanuki, Atsugi; Kouichi Harada, Fujisawa; Shiroh Saitoh, Kawasaki; Mamoru Izumi; Tsuyoshi Kobayashi, both of Tokyo; Masaru Kawachi, Yokohama, all of Japan

[73] Assignee: Kabushiki Kaisha Toshiba, Kawasaki, Japan

[21] Appl. No.: 09/038,145

[22] Filed: Mar. 11, 1998

Related U.S. Application Data

[63] Continuation-in-part of application No. 08/713,524, Sep. 13, 1996, abandoned.

[30] Foreign Application Priority Data

Sep. 13, 1995 [JP] Japan .................................... 7-234843
Jan. 8, 1996 [JP] Japan .................................... 8-000823
May 13, 1997 [JP] Japan .................................... 9-122384

[51] Int. Cl.$^7$ .................................................. H01L 41/08
[52] U.S. Cl. ............................ 310/358; 310/334; 310/337; 310/357
[58] Field of Search ................................... 310/334–337, 310/357–359, 311

[56] References Cited

U.S. PATENT DOCUMENTS

| 4,613,784 | 9/1986 | Haun et al. | 310/358 |
| 4,658,176 | 4/1987 | Nakaya et al. | 310/357 X |
| 4,683,396 | 7/1987 | Takeuchi et al. | 310/357 X |
| 4,728,845 | 3/1988 | Haun et al. | 310/357 X |
| 5,539,965 | 7/1996 | Safari et al. | 310/357 X |

*Primary Examiner*—Mark O. Budd
*Attorney, Agent, or Firm*—Oblon, Spivak, McClelland, Maier & Neustadt, P.C.

[57] ABSTRACT

An ultrasonic probe provided with an ultrasonic wave-transmitting/receiving element comprising a 1-3 type or 2-2 type composite piezoelectric body exposing a piezoelectric monocrystal from at least one of the faces of the composite piezoelectric body, and an electrode mounted on at least one of the faces of the composite piezoelectric body, wherein the composite piezoelectric body comprises a piezoelectric monocrystal whose electromechanical coupling coefficient ratio $k_{33}/k_t$ is 1.6 or more, and a resin whose acoustic impedance Zp is $4 \times 10^6$ kg/m$^2$s or less.

8 Claims, 3 Drawing Sheets

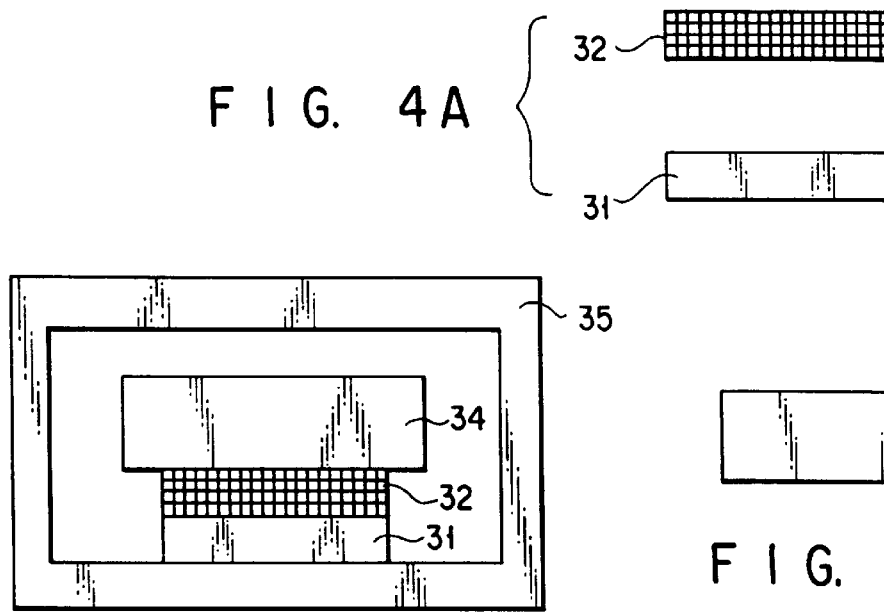
FIG. 4A
FIG. 4B
FIG. 4C
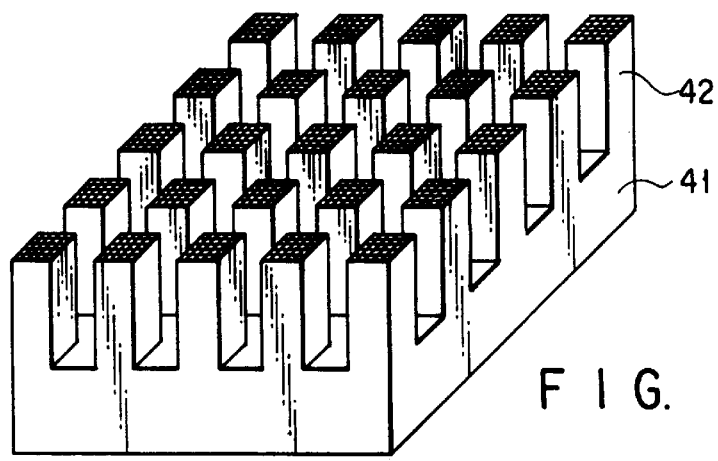
FIG. 5A
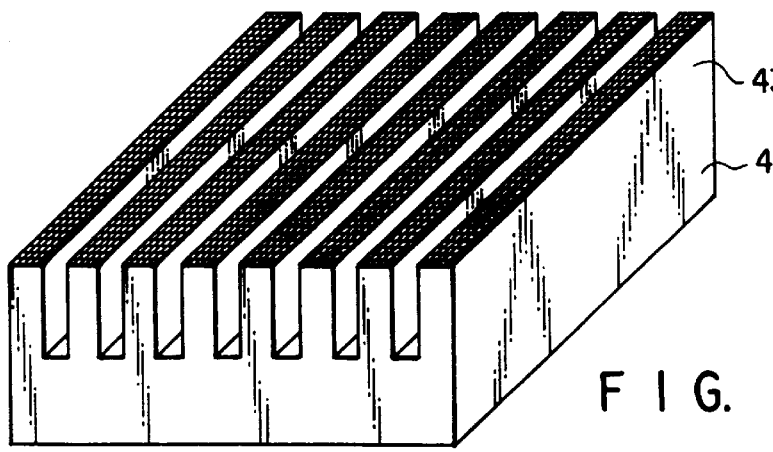
FIG. 5B

ULTRASONIC PROBE

CROSS-REFERENCE TO RELATED APPLICATIONS

This application is a continuation-in-part of U.S. patent application Ser. No. 08/713,524, filed Sep. 13, 1996 now abandoned.

BACKGROUND OF THE INVENTION

This invention relates to an ultrasonic probe to be used in an ultrasonic diagnostic apparatus for instance, and also to a method for manufacturing a monocrystal material suited for use as a piezoelectric element in an ultrasonic probe.

An ultrasonic probe is a device which is mainly constituted by a piezoelectric element and adapted to be used for imaging the inner structure of an object. The imaging of the inner structure of the object can be performed by emitting ultrasonic wave to the object and then receiving reflected waves from various interfaces of the object, the interfaces of which being different in acoustic impedance from each other. Examples of an ultrasonic imaging apparatus adopting such an ultrasonic probe include a medical diagnostic apparatus for examining the interior of human body, and an inspection apparatus for detecting a flaw in the interior of welded metallic portion.

With respect to a medical diagnostic apparatus, the diagnostic capability has been greatly improved due to the development of the CFM method (Color Flow Mapping method) enabling the velocity of bloodstream to be color-displayed in addition to the display of the tomogram (B-mode image) of human body. According to this CFM method, an ultrasonic wave is emitted to the heart, liver or carotid arteries, and the velocity of bloodstream is two-dimensionally color-displayed by making the most of the Doppler shift derived from the bloodstream. This CFM method is now utilized in the diagnosis of various kinds of organs of human body such as the womb, liver, spleen etc. It is also considered as being possible to diagnose thrombus of blood vessel in the heart for instance by making use of the CFM method while contacting an ultrasonic probe onto the surface of human body. Therefore, studies are now continued for developing a more sensitive apparatus of this kind.

Meanwhile, in the case of the B-mode image, even a small lesion or void due to a physical change is desired to be clearly observed down to a deep part thereof. Therefore, it is desired to obtain an image of high resolution in high sensitivity. On the other hand, in the case of Doppler mode for obtaining a CFM image, a reflection echo from minute blood cell having a diameter of several microns is utilized, so that the level of signal to be obtained is lower than that in the case of the aforementioned B-mode. Therefore, the requirements for high sensitivity in the Doppler mode are more severe as compared with the B-mode.

Conventionally, various improvements have been made on the ultrasonic probe itself or on the diagnostic apparatus for achieving a high sensitivity. For example, in the case of the B-mode, since the influence of a piezoelectric element functioning as an ultrasonic transmitting-receiving element upon the performance of ultrasonic probe can not be disregarded, a material which is high in electromechanical coupling coefficient and in dielectric constant has been employed. Since a material having a large dielectric constant can be easily matched with transmit-receive circuit, any loss due to the capacitance of cable or apparatus can be minimized. As a material meeting these requirements, a lead zirconate titanate-based piezoelectric ceramics (PZT) has been predominantly employed.

As for the ultrasonic probe, an array type ultrasonic probe where about 10 to 200 pieces of strip-shaped piezoelectric elements are arranged has been predominantly employed. The number of piezoelectric elements in the ultrasonic probe tends to increase as a demand for an ultrasonic probe of higher resolution is increasing. However, in view of avoiding the contact failure of the ultrasonic probe onto a living body, the aperture of ultrasonic wave-emitting face can not be enlarged over a predetermined limitation. As a result, as the number of piezoelectric elements in an ultrasonic probe increases, the size of individual piezoelectric element is required to be minimized, thus giving rise to a problem that piezoelectric elements can be hardly matched with the transmit-receive circuit.

There have been proposed various methods for solving the aforementioned problems. For example, U.S. Pat. No. 4,958,327 discloses a laminate structure of piezoelectric elements, and German Patent No. 3,729,731 A1 discloses the employment of an impedance converter.

However, both of them are not necessarily satisfactory for solving the aforementioned problems. For example, if piezoelectric elements are formed into a laminate structure, the transmitting sensitivity may be improved as the number of layers constituting the laminate is increased, but the receiving sensitivity is deteriorated on the contrary. Therefore, the applicability of the laminate structure of piezoelectric elements is limited to a special applications such as where a vibrator is extraordinary smaller or where the cable is extraordinary longer. On the other hand, if an impedance converter such as an emitter follower is employed, it will lead to an enlargement of the ultrasonic probe, and at the same time the frequency of the ultrasonic probe may be restricted to a narrow-band due to the frequency characteristics inherent to the impedance converter.

Moreover, the conventional PZT type ceramics tends to indicate a smaller electromechanical coupling coefficient as the relative dielectric constant thereof exceeds over 4,000, thus giving rise to another problem that the sensitivity thereof may be deteriorated. There are also known other kinds of piezoelectric materials, e.g. monocrystalline materials such as lithium niobate; ceramics such as lead titanate and lead metaniobate; and polymer materials such as polyvinylidene fluoride or a copolymer thereof. These piezoelectric materials however are too small in dielectric constant and in electromechanical coupling coefficient to put them to practical use.

On the other hand, it has been also proposed to employ a composite piezoelectric element (or a composite piezoelectric body) wherein a columnar or powdery piezoelectric material is buried in a resin as disclosed in Japanese Patent Publication Shou/54-19151; Japanese Patent Unexamined Publication Shou/60-97800; Japanese Patent Unexamined Publication Shou/61-53562; and Japanese Patent Unexamined Publication Shou/61-109400. Methods for manufacturing such a composite piezoelectric element are disclosed for example in Japanese Patent Unexamined Publication Shou/57-45290; Japanese Patent Unexamined Publication Shou/58-21883; Japanese Patent Unexamined Publication Shou/60-54600; Japanese Patent Unexamined Publication Shou/60-85699; Japanese Patent Unexamined Publication Shou/62-122499; and Japanese Patent Unexamined Publication Shou/62-131700.

The composite piezoelectric element is advantageous over the single piezoelectric element in that the acoustic impedance thereof is closer to that of living body, since the acoustic impedance of the composite piezoelectric element is smaller than that of the single piezoelectric element. Moreover, in the case of 1-3 type or 2-2 type composite piezoelectric body among others, the electromechanical coupling coefficient can be further improved as compared with a composite piezoelectric element of thin plate type. For the manufacture of the composite piezoelectric element, a PZT-type piezoelectric ceramics has been predominantly employed in view of high dielectric constant and high electromechanical coupling coefficient $k_{33}$ thereof.

However, as a matter of fact, the composite piezoelectric element is accompanied with a problem that since it involves the inclusion of a resin, the dielectric constant may be caused to be deteriorated and the improvement on electromechanical coupling coefficient is not so prominent as compared with the lowering of the dielectric constant. Therefore, the composite piezoelectric element composed of a monocrystalline material and a resin is useful only for a single-type mechanical probe having a large element surface or an annular array, and is scarcely used for the prevailing types of the device such as a phased array, a convex array or a linear array.

As explained above, there have been proposed various means for obtaining an ultrasonic probe of high sensitivity, such as a method of employing a piezoelectric ceramics of high dielectric constant, e.g. a lead zirconate titanate; a method of interposing an impedance converter between a vibrator and a cable; or a method of forming a piezoelectric material into a laminate structure. However, any of these proposals have accompanied with the aforementioned problems.

As for other kinds of piezoelectric materials, the dielectric constant and electromechanical coupling coefficient thereof are so small that it is difficult with the employment of them to achieve a sufficient improvement on the sensitivity of ultrasonic probe. Furthermore, in the case of a composite structure composed of a piezoelectric material and a resin, an improvement on electromechanical coupling coefficient is not so prominent as compared with the lowering of the dielectric constant, so that such a composite structure is not employed for a general-purpose ultrasonic probe.

Recently, a piezoelectric monocrystal consisting of a binary system represented by a general formula $Pb\{(B1B2)_{1-x}Ti_x\}O_3$ is attracting attentions as a new candidate for the piezoelectric material. In this formula, B1 denotes at least one element selected from the group consisting of Zn, Mg, Ni, Sc, In and Yb; B2 is at least one element selected from the group consisting of Nb and Ta; and the content of lead titanate is in the range of 0 to 55 mol. %. In this perovskite compound, 10 mol. % or less of lead may be substituted by at least one element selected from the group consisting of Ba, Sr, Ca and La.

When this monocrystalline material is employed for the manufacture of an ultrasonic probe to be driven with a low frequency, the material can be formed into a thin monocrystal so that it can be cut in high precision into a rectangular bar vibrator even with a thin blade. As a result, the yield with respect to high working precision can be improved, thereby making it possible to suppress a decrease of sensitivity and an increase of side lobe level.

However, a solid solution type monocrystal such as $Pb[(B1B2)_{1-x}Ti_x]O_3$ has drawbacks that the interior of the monocrystal is more likely to be damaged by inclusion of flux, cracks or flaws, so that the cutting of the monocrystal for preparing a vibrator for an ultrasonic probe has to be carried out while avoiding the aforementioned defective regions of the monocrystal. A standard size demanded for a vibrator for a cardiac probe for use in an ultrasonic diagnostic apparatus is 15 mm×15 mm×0.4 mm. However, since the cutting-out of the vibrator from the monocrystal is performed while avoiding a defective region affected for instance by an inclusion, the yield of the vibrator of this size is actually extremely low.

Furthermore, there is another problem that when the vibrator is subjected to a polarization treatment by applying a direct current thereto after electrodes are formed on the vibrator, cracks may be generated in the vibrator. The cracking of the vibrator may be generated at ratio of up to 50% in worst case, thus badly hindering the mass production of the vibrator.

BRIEF SUMMARY OF THE INVENTION

Accordingly, an object of the present invention is to provide an ultrasonic probe of high sensitivity.

Another object of this invention is to provide a method of producing an oxide monocrystal represented by $Pb\{(B1B2)_{1-x}Ti_x\}O_3$, which is free from the generation of cracks or the entrapment of inclusion in the interior of the monocrystal, and also free from the generation of cracks in a vibrator to be produced from the monocrystal after being subjected to a polarization treatment.

Namely, according to the present invention, there is provided an ultrasonic probe provided with an ultrasonic wave-transmitting/receiving element comprising:

a 1-3 type or 2-2 type composite piezoelectric body exposing a piezoelectric monocrystal from at least one of the faces of the composite piezoelectric body; and an electrode mounted on the at least one of the faces of the composite piezoelectric body;

wherein the composite piezoelectric body comprises a piezoelectric monocrystal whose electromechanical coupling coefficient ratio $k_{33}/k_t$ is 1.6 or more, and a resin whose acoustic impedance Zp is $4\times10^6$ kg/m²s or less.

According to this invention, there is also proposed a method of manufacturing an oxide monocrystal comprising the steps of:

contacting a flat smooth surface of a ceramic sintered body with a flat smooth surface of a seed monocrystal having a lattice constant which is equivalent to that of the ceramic sintered body with a deviation being limited to within ±10%, the ceramic sintered body being constituted by a composite perovskite compound represented by the following general formula (1) and having a sintered density of not less than 99% based on the theoretical density;

heating a composite body consisting of the ceramic sintered body and the seed monocrystal in a closed vessel filled with a lead atmosphere at a temperature of 1,000 to 1,450° C.:

$$Pb\{(B1B2)_{1-x}Ti_x\}O_3 \qquad (1)$$

wherein x is a value ranging from 0 to 0.55, B1 denotes at least one element selected from the group consisting of Zn, Mg, Ni, Sc, In and Yb; and B2 is at least one element selected from the group consisting of Nb and Ta.

According to this invention, there is also proposed a method of manufacturing an ultrasonic probe comprising the steps of;

covering an oxide seed crystal constituted by a composite perovskite compound represented by the following general formula (1) with ceramic powder constituted by the same element as those of the oxide seed crystal, and press-molding the resultant structure to form a composite body;

heating the composite body in a closed vessel filled with a lead atmosphere at a temperature of 1,000 to 1,450° C. thereby to obtain an oxide monocrystal;

cutting out a monocrystal plate from the oxide monocrystal;

forming a conductive film on an ultrasonic wave-transmitting/receiving face of the monocrystal plate as well as on a surface of the monocrystal plate, which is opposite to the transmitting/receiving face;

subjecting the monocrystal plate interposed between a couple of the conductive films to a polarization treatment by applying a dc voltage to the conductive films;

forming an acoustic matching layer on the transmitting/receiving face of the monocrystal plate, and disposing the monocrystal plate on a backing material with the surface, which is opposite to the transmitting/receiving face, being faced to the backing material;

cutting the monocrystal plate into plural pieces from the side of the acoustic matching layer by making use of a blade, thereby forming on the backing material a plurality of piezoelectric bodies separated from each other and having a first electrode and a second electrode, and forming a plurality of acoustic matching layers each disposed on each piezoelectric body; and forming an acoustic lens on each acoustic matching layer:

$$Pb\{(B1B2)_{1-x}Ti_x\}O_3 \quad (1)$$

wherein x is a value ranging from 0 to 0.55, B1 denotes at least one element selected from the group consisting of Zn, Mg, Ni, Sc, In and Yb; and B2 is at least one element selected from the group consisting of Nb and Ta.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate a presently preferred embodiment of the invention and, together with the general description given above and the detailed description of the preferred embodiment given below, serve to explain the principles of the invention.

FIGS. 4A to 4C are plan views each schematically illustrating the process for manufacturing an oxide monocrystal according to this invention;

FIGS. 5A and 5B are perspective views each illustrating an example of ceramic sintered body to be employed in the manufacture of an oxide monocrystal according to this invention.

DETAILED DESCRIPTION OF THE INVENTION

This invention will be further explained with reference to drawings showing ultrasonic probes according to this invention.

Figure 1:
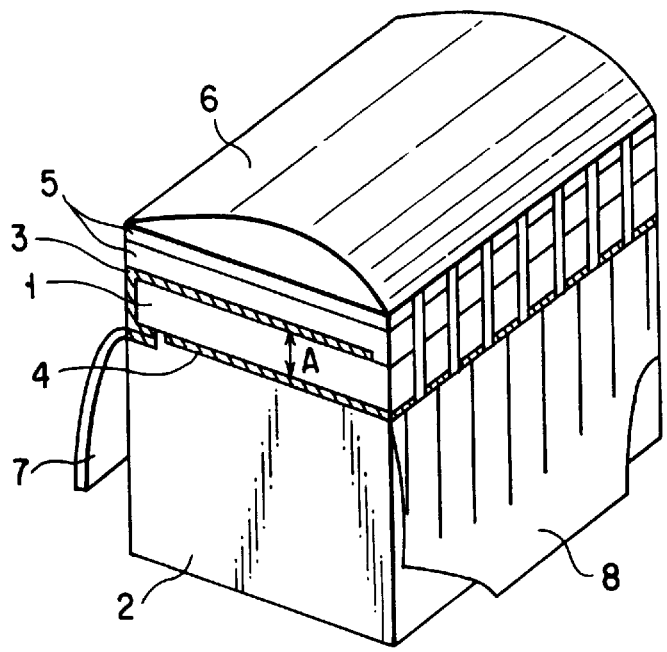
FIG. 1 is a perspective view showing a construction of an ultrasonic probe according to this invention.
Figure 2:
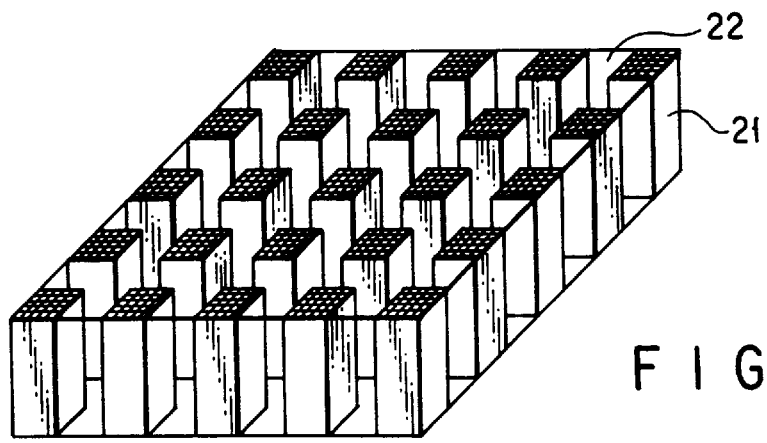
FIG. 2 is a perspective view illustrating one example of the structure of a composite piezoelectric elements to be employed in an ultrasonic probe according to this invention.
Figure 3:
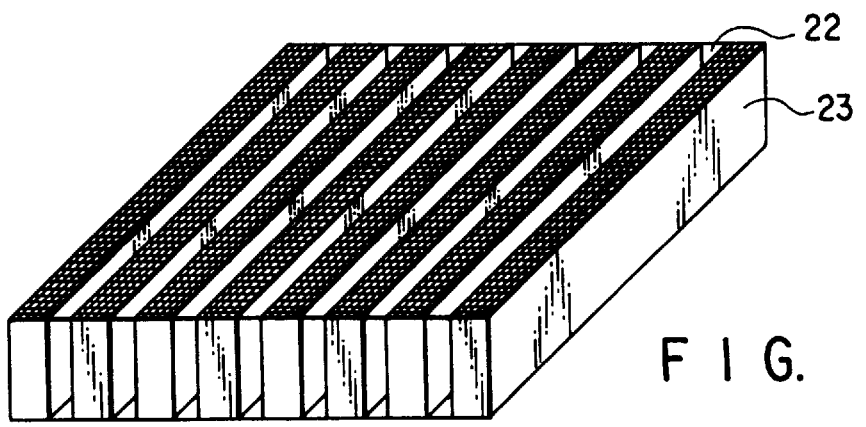
FIG. 3 is a perspective view illustrating another example of the structure of a composite piezoelectric elements to be employed in an ultrasonic probe according to this invention.

FIG. 1 shows a perspective view of the construction of an ultrasonic probe according to this invention. As shown in FIG. 1, according to the ultrasonic probe of this invention, a plurality of the composite piezoelectric elements 1, each comprising a monocrystal and a resin, are bonded on a packing material 2 in such a manner that the composite piezoelectric elements 1 are kept apart from each other. In this case, the composite piezoelectric elements 1 may be a 1-3 type structure as shown in FIG. 2, or a 2-2 type structure as shown in FIG. 3. The 1-3 type composite piezoelectric body is constructed such that a plurality of columnar piezoelectric elements 21 are buried in a resin 22. On the other hand, the 2-2 type composite piezoelectric body is constructed such that a plurality of strip-like piezoelectric elements 23 are buried in a resin 22.

Each of piezoelectric elements 1 vibrates in the direction as shown by an arrow A in FIG. 1. In the ultrasonic probe shown in the drawing, a first electrode 3 is formed on the ultrasonic wave-transmitting/receiving face of each piezoelectric element 1. This first electrode 3 is extended via the side wall of the piezoelectric element 1 to a portion of the back face which is opposite to the ultrasonic wave-transmitting/receiving face (an interface between the piezoelectric element 1 and the packing material 2), thus forming a turning electrode. This first electrode 3 may not necessarily be formed into such a turning electrode, but may be formed only on the faces perpendicular to the direction A. This first electrode 3 is connected to a common electrode substrate 7.

On the back face of each piezoelectric element 1, which is opposite to the ultrasonic wave-transmitting/receiving face is formed a second electrode 4 in such a manner that the second electrode 4 is spaced apart by a predetermined distance from the first electrode 3. This second electrode 4 is connected to a flexible printed wiring board 8 by means of soldering or a conductive paste, thereby forming a lead wire. With this combination of the piezoelectric elements 1, the first electrodes 3 and the second electrodes 4, an ultrasonic wave-transmitting/receiving element is constructed.

An acoustic matching layer 5 is formed on each of the ultrasonic wave-transmitting/receiving face of the piezoelectric element 1, where the first electrode 3 is also formed as mentioned above. In the embodiment shown in this drawing, the acoustic matching layer 5 is constructed as a 2-ply structure. However, the acoustic matching layer 5 may be a single structure or a three- or more-ply structure. An acoustic lens 6 is further formed all over the individual acoustic matching layer 5.

It has been found by the present inventors that if the electromechanical coupling coefficient of a piezoelectric monocrystal and the acoustic impedance of a resin are restricted to specific ranges in the manufacture of a composite piezoelectric body comprising a piezoelectric monocrystal and a resin, a composite piezoelectric body having desired properties meeting all of requirements can be obtained. Namely, according to this invention, the ratio between the electromechanical coupling coefficient $k_{33}$ in the longitudinal direction of a columnar piezoelectric monocrystal and the electromechanical coupling coefficient $k_t$ in the thickness-wise direction of a thin plate of piezoelectric monocrystal is selected to be 1.6 or more, and the acoustic impedance of a resin for burying the piezoelectric monocrystal is selected to be $4\times10^6$ kg/m²s or less. In this case, the value of $k_{33}$ should desirably be 80% or more, and the value of $k_t$ should desirably be 50% or more. When a piezoelectric monocrystal and a resin, each having the aforementioned properties, are employed for constructing a composite piezoelectric body of 1-3 type or 2-2 type, the acoustic impedance of the composite piezoelectric body can be made close to that of a living body, while maintaining a high electromechanical coupling coefficient.

With the employment of a composite piezoelectric body comprising a piezoelectric monocrystal and a resin, the deterioration of dielectric constant can not be avoided. However, since the acoustic impedance would be lowered and the coupling coefficient can be improved, the performance of the resultant ultrasonic probe can be improved. If the ratio $k_{33}/k_t$ is less than 1.6, the degree of contribution by the lowering of acoustic impedance and by the improvement of coupling coefficient to the improvement of the ultrasonic probe may prevail over the negative effect by the lowering of dielectric constant on the ultrasonic probe, it would be still insufficient for providing any significant improvement on sensitivity, i.e., an improvement by 2 dB or more in sensitivity. Moreover, if the ratio $k_{33}/k_t$ is less than 1.6, the degree of improvement on the coupling coefficient is too small so that it is impossible to attain any significant expansion of frequency band, i.e. an expansion by more than 20%.

On the other hand, if the acoustic impedance of the resin exceeds over $4\times10^6$ kg/m²s, the coupling coefficient to be obtained as the piezoelectric body is fabricated into a composite structure approaches to $k_t$, so that any advantage that can be brought about by the lowering of the acoustic impedance may be offset by the negative effect resulting from the lowering of the dielectric constant. By the way, if the acoustic impedance is too small, the mechanical strength of the composite piezoelectric body would be deteriorated. Therefore, in the practical use, the acoustic impedance should preferably be $1\times10^6$ kg/m²s or more.

As for the piezoelectric monocrystal, it is preferable to employ a solid solution type piezoelectric monocrystal containing at least lead titanate, such as $Pb\{(B1B2)_{1-x}Ti_x\}O_3$, wherein x is in the range of 0.05 to 0.55; B1 denotes at least one element selected from the group consisting of Zn, Mg, Ni, Sc, In and Yb; and B2 is at least one element selected from the group consisting of Nb and Ta.

This invention will be further explained with reference to the following examples.

EXAMPLE 1

As starting materials, PbO, ZnO, $Nb_2O_5$ and $TiO_2$, each high in purity, were employed and the purity of these compounds were corrected. Thereafter, these compounds were mixed such that the molar ratio between lead zinc niobate (PZN) and lead titanate (PT) becomes 91:9. To this mixture was further added an equal weight of PbO as a flux. To this powder mixture was added pure water and then blended in a ball mill containing $ZrO_2$ balls for one hour. Thereafter, water in the mixture was removed and then sufficiently pulverized by making use of an atomizer. Then, the pulverized mixture was introduced into a rubber mold and rubber-pressed under a pressure of 2 tons/cm².

The resultant solid body was taken out of the rubber mold, and 600 g of the solid body was charged in a platinum container having a diameter of 50 mm and a volumetric capacity of 250 cm³, and then heated up to 900° C. over 4 hours thereby melting the solid body. Subsequently, the molten material was cooled and then another 400 g of the solid body obtained from the aforementioned rubber press was added to the platinum container, which was then hermetically closed and placed at the center of an electric furnace. Thereafter, the furnace was heated up to 1260° C. over 5 hours, then gradually cooled down to 800° C. at a cooling rate of 0.8° C./hr, and allowed to be cooled down to room temperature. Subsequently, 30% conc. nitric acid was added to the platinum container and the contents in the platinum container were boiled for 8 hours to take out a solid solution type monocrystal from the platinum container.

The resultant monocrystal was of an arrowhead-like shape, measuring about 20 mm square. A portion of the monocrystal was then taken out and pulverized to investigate the crystal structure by means of X-ray diffraction, confirming the formation of perovskite structure. Thereafter, the <001> axis of the monocrystal was detected by making use of a Laue X-ray camera and the monocrystal was cut in perpendicular to the <001> axis with a cutter.

The cut face of the monocrystal piece was polished using #2000 abrasive to obtain a 500 μm thick monocrystal piece. Thereafter, a Ti/Au electrode was formed on both surfaces of monocrystal piece by means of sputtering method. Then, the monocrystal piece was dipped into a silicone oil heated to 200° C. and then the silicone oil was cooled down to 40° C. while applying an electric field of 1 kV/mm thereby performing polarization treatment. Subsequently, the monocrystal piece was shaped into a 300 μm square rod by making use of a dicing saw to measure an electromechanical coupling coefficient $k_{33}$. At the same time, an electromechanical coupling coefficient $k_t$ was also measured using a sample of the monocrystal piece of thin plate. As a result, $k_{33}$ was found to be 92%, and $k_t$ was found to be 55%, i.e., $k_{33}/k_t=1.67>1.6$.

Thereafter, a plurality of grooves 450 μm in depth and 200 μm in pitch were formed on the monocrystal having a thickness of 500 μm by making use of a 50 μm thick blade of a dicing saw, thereby forming an array of grooves. Namely, the monocrystal was not completely cut off, but the integration of the monocrystal was still kept by a 50 μm thick uncut portion below each of the grooves. Then, epoxy resin having an acoustic impedance of $3\times10^6$ kg/m²s was filled in the grooves formed through cutting and then cured.

Then, a plurality of grooves of the same size as described above were formed in perpendicular to the aforementioned grooves formed in advance, and then filled with the aforementioned epoxy resin in the same manner as mentioned above. The epoxy resin thus filled was also allowed to be cured. As a result, a structure where a plurality of columnar monocrystals were buried in the resin was obtained. Subsequently, the uncut portion of the monocrystal was polished away so as to allow the thickness of the resultant composite structure to be reduced to a thickness of 400 μm. Thereafter, a Ti/Au electrode was formed on both surfaces of monocrystal by means of sputtering method, thus forming a composite piezoelectric body. When an electromechanical coupling coefficient was measured under this condition, a value of 88% was obtained, indicating a remarkably high electromechanical coupling coefficient.

In the above example, a composite piezoelectric body of 1-3 type was manufactured by making use of the aforementioned process. However, the manufacturing method is not confined to the above. For instance, the monocrystal may be completely cut off in the beginning, or grooves may be formed in a matrix form in the beginning and then a resin may be filled therein. Furthermore, when epoxy resin is filled in two steps as described above, two different kinds of resins may be employed for filling the grooves. The uncut portion of the monocrystal may not be completely polished away after the filling a resin. The composite piezoelectric body thus formed may be subjected to additional polarization treatment if required.

If the direction of grooves to be cut in the monocrystal is limited to only one direction, a composite piezoelectric body of 2-2 type can be manufactured by using the same process as mentioned above.

An array type ultrasonic probe was manufactured by making use of the 1-3 type composite piezoelectric body obtained according to the aforementioned process. First of all, for the purpose of forming a turning electrode, one slit was formed in one of the electrodes formed on the both surfaces of the composite piezoelectric body. Namely, the slit was formed in one of the electrodes in parallel with the edge of the composite piezoelectric body by means of etching thereby separating the one electrode into two parts, and then the edge of one of the slit electrode and the edge of the other electrode were connected with each other by coating a conductive paste on the space between these edges, thereby forming the turning electrode 3. It should be noted however that this invention is not confined to the provision of such a turning electrode.

To this composite piezoelectric body 1 provided with electrodes (Ti/Au) 3 and 4 were connected the flexible wiring board 8 and the common electrode plate 7 by making use of a conductive paste. After the acoustic matching layer 5 was formed on the ultrasonic wave emitting surface of the composite piezoelectric body 1, the composite piezoelectric body 1 was adhered onto the packing material 2 by making use of epoxy resin with the opposite surface of the composite piezoelectric body 1 which was remote from the acoustic matching layer 5 being faced to the packing material 2. Thereafter, the composite piezoelectric body 1 was cut off together with the acoustic matching layer 5 at a pitch of 200 $\mu$m with a 50 $\mu$m thick blade of a dicing saw. The partition for forming an array may be performed by means of etching. Subsequently, an acoustic lens 6 was adhered all over the acoustic matching layer 5. Finally, a coaxial cable 110 pF/m in electrostatic capacity and 2 m in length was connected to a flexible wiring board 8 thereby to obtain an array probe.

When a reflection echo was measured on this ultrasonic probe by means of a pulse echo method, an echo having a center frequency falling within 2.48±0.1 MHz was received from every elements. A relative band at −6 dB was 93% in average, thus indicating a possibility of setting a more wide Doppler reference frequency as compared with the conventional ultrasonic probe.

COMPARATIVE EXAMPLE 1

A composite piezoelectric body was prepared by making use of a lead zircon titanate piezoelectric ceramics, and then an array type ultrasonic probe was prepared using this composite piezoelectric body. Then, $k_{33}$ and $k_t$ were measured, finding 75% as for $k_{33}$ and 50% as for $k_t$, and hence $k_{33}/k_t$=1.5, which was smaller than 1.6.

The composite piezoelectric body employed in this case was 1-3 type structure which was the same as that of Example 1. All of the conditions such as cutting pitch and a resin filler were made the same as those employed in Example 1 except that the thickness of the piezoelectric body was set to 550 $\mu$m. The electromechanical coupling coefficient of the resultant composite piezoelectric body was found to be 70%.

An array type ultrasonic probe was manufactured by making use of this composite piezoelectric body in the same manner as explained in Example 1. When the pulse echo characteristics of this ultrasonic probe was measured, the center frequency was found to be 2.52 MHz, thus indicating almost the same level as that in Example 1. The reason for obtaining almost the same center frequency as that of Example 1 even if the thickness of the piezoelectric body was varied can be ascribed to differences in acoustic velocity and in coupling coefficient. The peak value of the echo wave was −7 dB as compared with Example 1 and the relative band at −6 dB was 76%.

COMPARATIVE EXAMPLE 2

A composite piezoelectric body was prepared in the same manner as in Example 1 except that a resin to be used for filling the grooves of the monocrystal had an acoustic impedance of 5×10$^6$ kg/m$^2$s. The coupling coefficient of this composite piezoelectric body was found to be 82%, which was smaller than that of Example 1.

An array type ultrasonic probe was manufactured by making use of this composite piezoelectric body in the same manner as explained in Example 1. When the pulse echo characteristics of this ultrasonic probe was measured, the peak value of the echo wave was −2 dB as compared with Example 1 and the relative band at −6 dB was 86%, indicating a poor performance as compared with Example 1.

COMPARATIVE EXAMPLE 3

An array type ultrasonic probe was manufactured by making use of a piezoelectric monocrystal of the same kind as employed in Example 1 without making use of a composite piezoelectric body. When the pulse echo characteristics of this ultrasonic probe was measured, the peak value of the echo wave was −4 dB as compared with Example 1 and the relative band at −6 dB was 85%, indicating a poor performance as compared with Example 1.

The ultrasonic probe of this invention has been explained above with reference to a specific example, but it should not be construed that this invention is limited by this specific example. Rather, it should be understood that various variations are possible. For instance, as for the piezoelectric monocrystal, at least one element selected from the group consisting of Mg, Ni, Sc, In or Yb may be employed in place of Zn. Further, part of Nb may be substituted by Ta. Even if any of these elements are employed, an ultrasonic probe exhibiting an excellent performance can be obtained.

In the above example, the electrode was formed by means of a sputtering method. However, the electrode may be formed by means of a silver-baking method or a vapor deposition method. Further, instead of Ti/Au, other kinds of electrode materials such as Ni/Au or Cr/Au may be employed. Namely, there is no restriction regarding the electrode material as long as it has predetermined magnitudes of conductivity and adhesion strength.

The piezoelectric monocrystal may be prepared by using the Bridgman method, the Kyropoulos' method (a melt-pulling method), a zone melting method or a hydrothermal growth method. However, the employment of the following method is preferred in view of easily obtaining a uniform monocrystal free from any internal cracks.

Namely, it has been found after extensive studies made by the present inventors that the generation of flux inclusion or cracks in the monocrystal represented by the general formula $Pb\{(B1B2)_{1-x}Ti_x\}O_3$ can be ascribed to the manufacturing method thereof. Namely, the monocrystal of this kind has been conventionally manufactured using a flux containing as a main component lead oxide at a high temperature and making use of a flux method, a Kyropoulos' method, the Bridgman method, or a floating zone method. As a result, cracks, flux or foreign matters of pyrochlore structure may be more likely to be generated in the interior of the resultant monocrystal, thus making it difficult to obtain an excellent monocrystal of large size.

In view of these phenomena, it was assumed by the present inventors that a method of manufacturing a monocrystal without employing any flux might be an effective method for obtaining a uniform monocrystal free from any internal cracks or flux inclusion, thus finding out the following method.

Namely, the first method of manufacturing an oxide monocrystal comprises the steps of:

contacting a flat smooth surface of a ceramic sintered body having at least one flat smooth face with a flat smooth surface of a seed monocrystal having at least one flat smooth face and a lattice constant which is equivalent to that of the ceramic sintered body with a deviation being limited to within ±10% thereby obtaining a composite body consisting of the ceramic sintered body and the seed monocrystal, said ceramic sintered body being constituted by a composite perovskite compound represented by the following general formula (1) and having a sintered density of not less than 99% based on the theoretical density;

heating the composite body consisting of the ceramic sintered body and the seed monocrystal in a closed vessel filled with a lead atmosphere at a temperature of 1,000 to 1,450° C.:

$$Pb\{(B1B2)_{1-x}Ti_x\}O_3 \qquad (1)$$

wherein x is a value ranging from 0 to 0.55, B1 denotes at least one element selected from the group consisting of Zn, Mg, Ni, Sc, In and Yb; and B2 is at least one element selected from the group consisting of Nb and Ta.

The first manufacturing method according to this invention will be discussed in details as follows.

The ceramic sintered body to be employed in the first method of manufacturing an oxide monocrystal according to this invention is a composite perovskite compound represented by the aforementioned general formula (1). If the sintered density of this perovskite compound is less than 99% based on the theoretical density, it would be impossible to obtain a uniform monocrystal, and a crystal to be obtained under such conditions tends to be easily cracked as it is subjected to a polarization treatment in subsequent to the mounting of an electrode on the surface of the crystal.

If the value of "x" exceeds over 0.55 in the aforementioned general formula (1), the resultant crystal may be easily cracked as it is subjected to a polarization treatment and at the same time the insulation resistance of the resultant crystal may be lowered, thus making it difficult to polarize the crystal. If B1 and B2 are selected from elements other than those defined above, it would be difficult to obtain a monocrystalline material exhibiting an excellent piezoelectric characteristics superior than the PZT ceramics. If the monocrystal is to be formed into a composite body for use in the aforementioned ultrasonic probe, the value of "x" should preferably be at least 0.05 or more.

As for the ceramic perovskite compound, the ratio between A-site and B-site, i.e. (A/B) when the perovskite compound is represented by $ABO_3$ should preferably be in the range of 1.00 to 1.10. By the way, "A" represents Pb and "B" represents $\{(B1B2)_{1-x}Ti_x\}$. If (A/B) ratio is less than 1.00, the growth rate of the monocrystal becomes too slow, making it unpractical. On the other hand, if (A/B) ratio exceeds over 1.10, an extra amount of lead oxide constituting the "A" component may tend to be entrapped in the interior of the monocrystal. Furthermore, the excessive amount of lead oxide may be supplied from the supply source of lead oxide such as lead zirconate placed in the interior of the closed vessel.

The lead element of the composite perovskite compound may be partially substituted by any of Ba, Sr, Ca or La. In this case, the substitution ratio of these elements should preferably be confined to 10 mol. % or less in view of avoiding an excessive retardation of the growth rate of monocrystal.

The composite perovskite compound may contain a little amount of a transition metal such as Mn, Co, Fe, Sb, W, Cu or Hf; a lanthanide element; or alkali metals. However, the content of these elements should preferably be confined to 1 mol. % at most in view of maintaining a large piezoelectric constant.

The ratio between B1 element and B2 element in the aforementioned general formula (1) may be a stoichiometric ratio with an allowance of ±0.02 in general. This ratio however may be varied within ±0.2.

The perovskite compound may also contain an additive such as $SiO_2$, $Al_2O_3$, $B_2O_3$, PtO, MgO, $Fe_2O_3$ and $Bi_2O_3$. In this case, the content of $SiO_2$, $Al_2O_3$, $B_2O_3$ and PtO should preferably be confined to 0.5 mol. % or less, and the content of other compounds should preferably be confined to 1 mol. % or less. If the content of these additives exceeds over these limitations, pyrochlore crystal small in dielectric constant tends to be generated in addition to the perovskite crystal, thereby inviting an increase in crystal defect.

The perovskite compound may also contain 5 mol. % or less of $ZrO_2$. If the content of $ZrO_2$ exceeds over 5 mol. %, the growth rate of the monocrystal may be extremely lowered and at the same time the non-uniformity in composition inside the crystal may be promoted.

The ceramic sintered body may be manufactured, in addition to the ordinary sintering, by a hot hydrostatic press (HIP) or by a hot press. It is possible with the employment of these methods to easily obtain a sintered body having a sintered density of 99% or more based on the theoretical density.

The size of the ceramic sintered body to be employed in this invention may be suitably selected depending on the applications of the monocrystal. For instance, in the case of a medical ultrasonic probe, the size may be 15×(15 to 17)×0.5 $mm^3$. The smooth surface of this ceramic sintered body should preferably have a smoothness of ±1.0 μm or so, and most preferably be mirror-lapped.

By the way, the lattice constant of ceramic sintered body is 3.88 to 4.15 angstroms in general.

There is not any particular restriction with respect to the seed monocrystal to be employed in the manufacturing method of this invention as long as the seed monocrystal has a lattice constant which is equivalent to that of the ceramic sintered body with a deviation being limited to within ±10%. Since the metal to be formed on a monocrystal has a tendency to orientate according the underlying shape or form of the monocrystal, such a metal may be employed as an intermediate layer. In this case, Pt is generally employed as such an intermediate layer. If a seed monocrystal having a lattice constant which differs from that of the ceramic sintered body by more than ±10% is employed, a resultant crystal tends to be easily cracked as it is subjected to a polarization treatment. Moreover, it may be difficult to manufacture a monocrystal having a size of 10 mm square or more. It should be note that the difference between the lattice constant of a ceramic sintered body and the lattice constant of a seed monocrystal should preferably be as small as possible, i.e. most desirably the lattice constant of a ceramic sintered body should be identical with that of a seed monocrystal.

As long as the aforementioned requirements with respect to the lattice constant are met, the seed monocrystal to be employed in the first method of this invention may be selected from materials which quite differ from the ceramic sintered body such as MgO or $SrTiO_3$ for instance. However, the employment of a seed monocrystal having the same composition as that of a ceramic sintered body is preferable, since the generation of any cracks in the cooling step thereof after the manufacture of a monocrystal having a size of 20 mm square or more can be avoided.

The size of the seed monocrystal may be suitably selected depending on the size of ceramic sintered body. It is preferable however that the size of the seed monocrystal is identical with that of the ceramic sintered body. The thickness of the seed monocrystal should be at least 0.3 mm or more. At least one of the smooth surfaces of the seed monocrystal should preferably have a smoothness of ±1.0 µm or so, and most preferably be mirror-lapped.

In the manufacture of an oxide monocrystal by making use of the first method of this invention, a predetermined seed monocrystal 31 and a predetermined ceramic sintered body 32 are prepared as shown in FIG. 4A. These materials respectively has properties meeting the aforementioned requirements and the contacting surfaces thereof are made smooth. Then, as shown in FIG. 4B, the smooth contacting surface of the seed monocrystal 31 is contacted with the smooth contacting surface of the ceramic sintered body 32, and then a weight 34 is placed on the ceramic sintered body 32. This stacked structure is then heated at a temperature of 1,000 to 1,450° C. in a closed vessel 35 filled with a lead atmosphere. The closed vessel 35 to be employed in this case may preferably be formed of platinum, palladium, rhodium, silver or an alloy of them, or formed of a porcelain sagger of high density. The employment of other materials other than exemplified above may be undesirable, since they may become a cause for the generation of cracks in the resultant monocrystal. The weight 34 may be suitably selected depending on the shape of the starting materials or on the manufacturing method. For instance, if the weight 34 is to be repeatedly used for a long period of time, the weight 34 should desirably be formed of platinum.

If the heating temperature is less than 1,000° C., the speed for forming a monocrystal may become too slow. On the other hand, if the heating temperature exceeds over 1,450° C., it may become difficult to obtain a uniform crystal of large size.

The heating time of the contacted body consisting of the ceramic sintered body and the seed monocrystal may be suitably selected depending for instance on the shape of the starting materials. For example, if the thickness of the contacted body is 10 mm or less, the heating time may preferably be in the range of 10 to 500 hours, more preferably in the range of 100 to 200 hours, during which the contacted body is heated at the aforementioned temperature to obtain a monocrystal 36 as shown in FIG. 4C.

As explained above, according to the first method of this invention, since a specific seed monocrystal and a specific ceramic sintered body are contacted with each other and heated in a closed vessel filled with a lead atmosphere to mono-crystallize the ceramic sintered body, it is possible to inhibit the generation of cracks and the entrapment of foreign matters such as flux, in the interior of the resultant monocrystal. Furthermore, it is possible to obtain an oxide monocrystal which is capable of inhibiting the generation of cracks in a vibrator after a polarization treatment.

Further, it is also possible according to this invention to obtain a triangular, cylindrical or fine columnar monocrystal element by suitably modifying the shape of the ceramic sintered body. In this case, the area of the smooth surface of the ceramic sintered body should preferably be made equal to or smaller than the area of the smooth surface of the seed monocrystal.

The shape of the ceramic sintered body may be those as shown in FIGS. 5A and 5B. Namely, the ceramic sintered body shown in FIG. 5A comprises a plate-like ceramic 41 and a plurality of columnar ceramics 42 arrayed systematically on the plate-like ceramic 41. After this ceramic sintered body is mono-crystallized, an epoxy resin is filled in the spaces between the columnar ceramics 42, thereby forming a 1-3 type composite piezoelectric body. The ceramic sintered body shown in FIG. 5B comprises a plate-like ceramic 41 and a plurality of strip-like ceramics 43 arrayed systematically on the plate-like ceramic 41. After this ceramic sintered body is mono-crystallized, an epoxy resin is filled in the spaces between the rectangular bar ceramics 43, thereby forming a 2-2 type composite piezoelectric body.

Namely, it is possible according to the first method of this invention to mono-crystallize a ceramic sintered body of any desired shape and to provide, by making use of the resultant monocrystal, an ultrasonic probe of any desired shape having higher sensitivity and reliability as compared with the PZT-type piezoelectric ceramics.

The solid solution type monocrystal to be manufactured according to this invention may be formed into a monocrystal of any desired shape or form depending on the shape or form of the seed crystal. For instance, if a monocrystal obtained by this invention is cut in a direction perpendicular to the [001] axis (or C-axis) of the monocrystal and electrodes are formed on the (001) plane of the monocrystal, a vibrator having an excellent electromechanical coupling coefficient can be obtained by subjecting the monocrystal to a polarization treatment. On the other hand, if a monocrystal obtained by this invention is cut in a direction perpendicular to the [111] axis of the monocrystal and electrodes are formed on the (111) plane of the monocrystal, a vibrator having a large dielectric constant can be obtained by subjecting the monocrystal to a polarization treatment.

When a monocrystal to be obtained by the first method of this invention is worked into a rectangular bar vibrator, the acoustic velocity in the thickness direction would be in the range of 2,000 to 3,500 m/s and the frequency constant, i.e. a product of the antiresonant frequency and the thickness would be in the range of 1,350 to 1,500 Hz.m. Whereas, in the case of the PZT-type piezoelectric ceramics, the frequency constant thereof would be in the range of 2,000 to 3,000 Hz.m, i.e. slower by 25 to 50% as compared with the vibrator of this invention. Furthermore, in the case of the rectangular bar vibrator of this invention, the electromechanical coupling coefficient $k_{33}$ for a rectangular bar vibrator of 15 mm×0.2 mm×0.4 mm is in the range of 72 to 85%, indicating an excellent and uniform electromechanical coupling coefficient, thus making it possible to obtain a vibrator of large size, e.g. about 100 mm in maximum diameter and high performance.

On the other hand, if a monocrystal obtained by the method of this invention is cut in a direction parallel with the [111] axis of the monocrystal and electrodes are formed on the (111) plane of the monocrystal, a vibrator having a high dielectric constant ranging from 2,000 to 8,000 can be obtained.

The first method of manufacturing an oxide monocrystal according to this invention will be further explained with reference to the following specific examples.

EXAMPLE 2

In this Example, a solid solution type monocrystal represented by the formula; $Pb\{(Mg_{1/3}Nb_{2/3})_{0.68}Ti_{0.32}\}O_3$ (hereinafter referred to simply as PMNT 68/32) was prepared.

First of all, a method of manufacturing a seed monocrystal will be explained in detail.

The seed monocrystal was prepared by way of the flux method using a flux comprising 80 mol. % of lead oxide (PbO) and 20 mol. % of boron oxide ($B_2O_3$).

As starting materials, PbO, MgO, $Nb_2O_5$ and $TiO_2$ powders, each high in purity, were employed. Thereafter, these compounds were mixed in such a ratio as to obtain the aforementioned composition. To this mixture was further added an equimolar weight of a PbO—$B_2O_3$ flux. After being fully mixed using a dry type mixing machine, the resultant mixed powder was introduced into a rubber vessel and rubber-pressed under a pressure of 2 tons/cm². The resultant solid body was taken out of the rubber vessel, and 600 g of the solid body was charged in a platinum container having a diameter of 50 mm and a volumetric capacity of 250 cm³, and then heated up to 900° C. over 4 hours thereby melting the solid body.

Subsequently, the molten material was cooled and then another 400 g of the solid body obtained from the aforementioned rubber press and comprising the aforementioned mixed powder and flux was added to the platinum container, which was then hermetically closed and placed at the center of an electric furnace. Thereafter, the furnace was heated up to 1200° C. over 12 hours, then gradually cooled down to 800° C. at a cooling rate of 1° C./hr, and finally allowed to be cooled down to room temperature. During this cooling step, oxygen gas was selectively blown against one lower portion of the platinum container so as to cause the generation of nucleus to occur at one point.

Subsequently, 30% conc. nitric acid was added to the platinum container and the contents in the platinum container were boiled for 8 hours to take out a solid solution type monocrystal from the platinum container. When the resultant monocrystal was observed, it was found to have an arrowhead-like shape, measuring about 20 mm square.

A portion of the monocrystal was then taken out and pulverized to investigate the crystal structure by means of X-ray diffraction, confirming the formation of perfect perovskite structure. When the composition of this powder was analyzed by means of the ICP, the value of "x" was found to be about 0.32. The lattice constant of this monocrystal was found to be 4.018 angstroms.

Thereafter, the [001] axis of the monocrystal was detected by making use of a Laue X-ray camera and the monocrystal was cut in perpendicular to the [001] axis with a cutter to obtain a 1 mm thick monocrystal piece. The cut face of the monocrystal piece was then polished and 10 pieces of rectangular vibrators each measuring 12 mm square were cut out from this monocrystal piece for subsequently using them as a seed crystal.

Next, the method of manufacturing a ceramic sintered body will be explained in detail. This ceramic sintered body was prepared by making use of the ordinary solid phase reaction method as follows.

First of all, as starting materials, PbO, MgO, $Nb_2O_5$ and $TiO_2$ powders, each high in purity, were employed and mixed in such a ratio as to obtain the composition of $Pb\{(Mg_{1/3}Nb_{2/3})_{0.68}Ti_{O.32}\}O_3$. After being added with pure water, the mixed powder was further mixed and pulverized for 20 hours in a nylon pot mill filled with zirconia balls. Subsequently, the resultant pulverized powder was dried and calcinated in an alumina sagger at a temperature of 800° C.

Thereafter, to this calcinated powder was added lead oxide at a ratio of 0.5% by weight, and pure water was again added to this calcinated powdery mixture. The resultant mixture was then pulverized in the aforementioned pot mill and subsequently dried to obtain a powdery mixture. Then, a 5% aqueous solution of PVA as a binder was added to the powdery mixture at a ratio of 5% by weight, and the resultant mixture was mixed in a mortar. The mixture was then passed through a sieve of #48 to granulate the mixture thereby obtaining granulates, which were then compressed in a mold under a pressure of 50 MPa to provisionally mold them into a columnar shape having a diameter of 40 mm and a length of 15 mm.

The molded body was then placed into a rubber mold and molded using a hydrostatic press under a pressure of 100 MPa to obtain a molded product, which was subsequently heated in an electric oven at a temperature of 500° C. for 4 hours thereby to burn out the binder. After this burn out step, the molded product was introduced into a double-layered magnesia sagger of high density and sintered at a temperature of 1,200° C. for 3 hours. Finally, the sintered body was hot-pressed at a pressure of 20 MPa in an oxygen atmosphere and at a temperature of 1,000° C. for 5 hours.

When the features of the resultant sintered body was examined, it was found that the density thereof was 99.5% of theoretical density, that the sintered body was constituted by a single phase of perfect perovskite structure and that the lattice constant thereof was 4.019 angstroms. A rectangular plate measuring 12 mm×12 mm×5 mm was cut out from this hot-pressed sintered body and one of the surfaces thereof was mirror-lapped, thus forming a sample of ceramic sintered body.

The difference in lattice constant between the ceramic sintered body manufactured in this Example and the seed monocrystal was 0.03%. This seed monocrystal and the ceramic sintered body were employed for manufacturing an oxide monocrystal as explained below.

First of all, the mirror-lapped surface of the seed monocrystal was contacted with the mirror-lapped surface of the hot-pressed sintered body sample, thus forming a laminated body, which was then placed in a platinum crucible and several sheets of hot-pressed sintered body made of the same material as the hot-pressed sintered body sample were placed on the hot-pressed sintered body sample as a weight. After being hermetically closed, the platinum crucible was further placed in a magnesia crucible, which was then subjected to a heat treatment in an electric furnace at a temperature of 1280° C. for 170 hours. Upon being cooled, the magnesia crucible was taken out of the electric furnace and the cut surface of the hot-pressed sintered body sample was observed. As a result, grain boundary was not found at all, thus confirming the monocrystallization of the hot-pressed sintered body sample.

A square plate measuring 12 mm×12 mm×0.4 mm was cut out from the newly mono-crystallized portion of the heat-treated body, which was then examined by means of the Laue X-ray method, confirming the monocrystallization of the hot-pressed sintered body sample. Then, 10 sheets of square plate having the same size as mentioned above were cut out from the mono-crystallized portion of the heat-treated body, and a Ni-Au electrode was formed on the both surfaces of the square plate by means of a sputtering method. These square plates were subjected to a polarization treatment in silicone oil heated to 180° C. by applying an electric field of 1.5 kV/mm, and then cooled down to room temperature. As a result, no crack was recognized in any of 10 sheets of the resultant vibrators polarized as explained above.

The vibrator thus obtained was cut by making use of a diamond blade, thus forming a rectangular element having a width of 150 μm, whose electromechanical coupling coefficient $k_{33}$, was then measured. As a result, $k_{33}$, was found to be 83%, and the fluctuation of the value was as small as not more than 2%.

EXAMPLE 3

In this Example, a solid solution type monocrystal represented by the formula; $Pb\{(Sc_{1/2}Nb_{1/2})_{0.29}(Mg_{1/3}Nb_{2/3})_{0.34}Ti_{0.37}\}O_3$ (hereinafter referred to simply as PSMNT 29/34/37) was prepared.

First of all, a method of manufacturing a seed monocrystal will be explained in detail.

The seed monocrystal was prepared by way of the flux method using a flux comprising 75 mol. % of lead oxide and 25 mol. % of boron oxide.

As starting materials, PbO, $Sc_2O_3$, MgO, $Nb_2O_5$ and $TiO_2$ powders, each high in purity (99.9% or more), were employed. Thereafter, these compounds were mixed in such a ratio as to obtain the aforementioned composition. To this mixture was further added a PbO—$B_2O_3$ flux in an amount two times as much as the molar weight of the composition. After being fully mixed using a dry type mixing machine, the resultant mixed powder was introduced into a rubber vessel and rubber-pressed under a pressure of 2 tons/cm². The resultant solid body was taken out of the rubber vessel, and 600 g of the solid body was charged in a platinum container having a diameter of 50 mm and a volumetric capacity of 250 cm³, and then heated up to 900° C. over 4 hours thereby melting the solid body.

Subsequently, the molten material was cooled and then another 400 g of the solid body obtained from the aforementioned rubber press and comprising the aforementioned mixed powder and flux was added to the platinum container, which was then hermetically closed and placed at the center of an electric furnace. Thereafter, the furnace was heated up to 1250° C. over 12 hours, then gradually cooled down to 800° C. at a cooling rate of 1° C./hr., and allowed to be cooled down to room temperature. During this cooling step, oxygen gas was selectively blown against one lower portion of the platinum container so as to cause the generation of nucleus to occur at one point.

Subsequently, 30% conc. nitric acid was added to the platinum container and the contents in the platinum container were boiled for 8 hours to take out a solid solution type monocrystal from the platinum container. When the resultant monocrystal was observed, it was found to have an arrowhead-like shape, measuring about 20 mm square.

A portion of the monocrystal was then taken out and pulverized to investigate the crystal structure by means of X-ray diffraction, confirming the formation of perfect perovskite structure. When the composition of this powder was analyzed by means of the ICP, the values of the components were found to correspond to those charged. The lattice constant of this monocrystal was found to be 4.025 angstroms.

Thereafter, the [001] axis of the monocrystal was detected by making use of a Laue X-ray camera and the monocrystal was cut in perpendicular to the [001] axis with a cutter to obtain a 1 mm thick monocrystal piece. The cut face of the monocrystal piece was then polished and 10 pieces of rectangular vibrators each measuring 12 mm square were cut out from this monocrystal piece for subsequently using them as a seed crystal.

Next, the method of manufacturing a ceramic sintered body will be explained in detail. This ceramic sintered body was prepared by making use of the ordinary solid phase reaction method as follows.

First of all, as starting materials, PbO, $Sc_2O_3$, MgO, $Nb_2O_5$ and $TiO_2$ powders, each high in purity, were employed and mixed in such a ratio as to obtain two different kinds of compositions, i.e. PSMNT 29/34/37 and PSMNT 58/00/42. After being added with pure water, each mixed powder was further mixed and pulverized for 20 hours in a nylon pot mill filled with zirconia balls. Subsequently, the resultant pulverized powder was dried and calcinated in an alumina sagger at a temperature of 800° C.

Thereafter, to this calcinated powder was added lead oxide at a ratio of 0.5% by weight, and pure water was again added to this calcinated powdery mixture. The resultant mixture was then pulverized in the aforementioned pot mill and subsequently dried to obtain a powdery mixture. Then, a 5% aqueous solution of PVA as a binder was added to the powdery mixture at a ratio of 5% by weight, and the resultant mixture was mixed in a mortar. The mixture was then passed through a sieve of #48 to granulate the mixture thereby obtaining granulates, which were then compressed in a mold under a pressure of 50 MPa to provisionally mold them into a columnar shape having a diameter of 40 mm and a length of 15 mm.

The molded body was then placed into a rubber mold and molded using a hydrostatic press under a pressure of 100 MPa to obtain a molded product, which was subsequently heated in an electric oven at a temperature of 500° C. for 4 hours thereby to burn out the binder. After this burn out step, the molded product was introduced into a double-layered magnesia sagger of high density and sintered at a temperature of 1,250° C. for 3 hours. Finally, the sintered body was hot-pressed at a pressure of 20 MPa in an oxygen atmosphere and at a temperature of 1,100° C. for 5 hours.

When the features of the resultant sintered body was examined, it was found that the density thereof was 99.7% of theoretical density, that the sintered body was constituted by a single phase of perfect perovskite structure and that the lattice constant of PSMNT 29/34/37 was 4.025 angstroms and the lattice constant of PSMNT 58/00/42 was 4.030 angstroms. A rectangular plate measuring 12 mm×12 mm×5 mm was cut out from each hot-pressed sintered body and one of the surfaces thereof was mirror-lapped, thus forming samples of ceramic sintered bodies.

The difference in lattice constant between the ceramic sintered bodies manufactured in this Example and the seed monocrystal was negligible in the case of PSMNT 29/34/37 and 0.15% in the case of PSMNT 58/00/42. This seed monocrystal and the ceramic sintered bodies were employed for manufacturing an oxide monocrystal as explained below.

First of all, the mirror-lapped surface of the seed monocrystal was contacted with the mirror-lapped surface of the hot-pressed sintered body sample, thus forming a laminated body, which was then placed in a platinum crucible and several sheets of hot-pressed sintered body made of the same material as the hot-pressed sintered body sample were placed on the hot-pressed sintered body sample as a weight. After being hermetically closed, the platinum crucible was further placed in a magnesia crucible, which was then subjected to a heat treatment in an electric furnace at a temperature of 1280° C. for 170 hours. Upon being cooled, the magnesia crucible was taken out of the electric furnace and the cut surface of the hot-pressed sintered body sample was observed. As a result, grain boundary was not found at all in any of the samples, thus confirming the monocrystallization of the hot-pressed sintered body samples.

A square plate measuring 12 mm×12 mm×0.4 mm was cut out from the newly mono-crystallized portion of the heat-treated body, which was then examined by means of the Laue X-ray method, confirming the monocrystallization of the hot-pressed sintered body sample. Then, 10 sheets of square plate having the same size as mentioned above were cut out from the mono-crystallized portion of the heat-treated body, and a Ni-Au electrode was formed on the both surfaces of the square plate by means of a sputtering method. These square plates were subjected to a polarization treatment in silicone oil heated to 220° C. by applying an electric field of 2 kV/mm, and then cooled down to room temperature. As a result, no crack was recognized in any of 10 sheets of the resultant vibrators polarized as explained above.

The vibrator thus obtained was cut by making use of a diamond blade, thus forming a rectangular element having a width of 150 μm, whose electromechanical coupling coefficient $k_{33'}$ was then measured. As a result, $k_{33'}$ was found to be 80%, and the fluctuation of the value was as small as not more than 2%.

EXAMPLE 4

In this Example, a solid solution type monocrystal represented by the formula; $Pb\{(Zn_{1/3}Nb_{2/3})_{0.30} (Mg_{1/3}Nb_{2/3})_{0.23}(Sc_{1/2}Ta_{1/2})_{0.18}Ti_{0.29}\}O_3$ (hereinafter referred to simply as PZMNSTT 30/23/18/29) was prepared.

First of all, a method of manufacturing a seed monocrystal will be explained in detail.

The seed monocrystal was prepared by way of the flux method using a flux comprising 90 mol. % of lead oxide and 10 mol. % of boron oxide.

As starting materials, PbO, $Sc_2O_3$, MgO, $Nb_2O_5$, $Ta_2O_5$ and $TiO_2$ powders, each high in purity, were employed. Thereafter, these compounds were mixed in such a ratio as to obtain the aforementioned composition. To this mixture was further added a PbO—$B_2O_3$ flux in an amount two times as much as the molar weight of the composition. The resultant mixed powder was rubber-pressed in the same manner as explained in the previous Examples to form a solid body, which was then heated to melt the solid body. Subsequently, the molten material was cooled and placed at the center of an electric furnace. Thereafter, the furnace was heated up to 1,250° C. over 12 hours, then gradually cooled down to 800° C. at a cooling rate of 1° C./hr., and allowed to be cooled down to room temperature. During this cooling step, oxygen gas was selectively blown against one lower portion of the platinum container so as to cause the generation of nucleus to occur at one point.

Subsequently, 30% conc. nitric acid was added to the platinum container and the contents in the platinum container were boiled for 8 hours to take out a solid solution type monocrystal from the platinum container. When the resultant monocrystal was observed, it was found to have an arrowhead-like shape, measuring about 20 mm square.

A portion of the monocrystal was then taken out and pulverized to investigate the crystal structure by means of X-ray diffraction, confirming the formation of perfect perovskite structure. When the composition of this powder was analyzed by means of the ICP, the values of the components were found to correspond to those charged. The lattice constant of this monocrystal was found to be 4.034 angstroms.

Thereafter, the [001] axis of the monocrystal was detected by making use of a Laue X-ray camera and the monocrystal was cut in perpendicular to the [001] axis with a cutter to obtain a 1 mm thick monocrystal piece. The cut face of the monocrystal piece was then polished and 10 pieces of rectangular vibrators each measuring 12 mm square were cut out from this monocrystal piece for subsequently using them as a seed crystal.

The ceramic sintered body was prepared as follows. First of all, as starting materials, PbO, $Sc_2O_3$, MgO, $Nb_2O_5$, $Ta_2O_5$ and $TiO_2$ powders, each high in purity, were employed and mixed in such a ratio as to obtain the composition of $Pb\{(Zn_{1/3}Nb_{2/3})_{0.30}(Mg_{1/3}Nb_{2/3})_{0.23}(Sc_{1/2}Ta_{1/2})_{0.18}Ti_{0.29}\}O_3$. After being added with pure water, the mixed powder was further mixed and pulverized for 20 hours in a nylon pot mill filled with zirconia balls. Subsequently, the resultant pulverized powder was dried and calcinated in an alumina sagger at a temperature of 800° C.

Thereafter, to this calcinated powder was added lead oxide at a ratio of 0.5% by weight, and pure water was again added to this calcinated powdery mixture. The resultant mixture was then pulverized in the aforementioned pot mill and subsequently dried to obtain a powdery mixture. Then, a 5% aqueous solution of PVA as a binder was added to the powdery mixture at a ratio of 5% by weight, and the resultant mixture was mixed in a mortar. The mixture was then passed through a sieve of #48 to granulate the mixture thereby obtaining granulates, which were then compressed in a mold under a pressure of 50 MPa to provisionally mold them into a columnar shape having a diameter of 40 mm and a length of 15 mm.

The molded body was then placed into a rubber mold and molded using a hydrostatic press under a pressure of 100 MPa to obtain a molded product, which was subsequently heated in an electric oven at a temperature of 500° C. for 4 hours thereby to burn out the binder. After this burn out step, the molded product was introduced into a double-layered magnesia sagger of high density and sintered at a temperature of 1,300° C. for 4 hours. Finally, the sintered body was hot-pressed in an oxygen atmosphere and at a temperature of 1,150° C. for 5 hours.

When the features of the resultant sintered body was examined, it was found that the density thereof was 99.2% of theoretical density, that the sintered body was constituted by a single phase of perfect perovskite structure and that the lattice constant thereof was 4.034 angstroms. A rectangular plate measuring 12 mm×12 mm×5 mm was cut out from this hot-pressed sintered body and one of the surfaces thereof was mirror-lapped, thus forming a sample of ceramic sintered body.

On the other hand, a $SrTiO_3$ monocrystal plate whose (110) plane was mirror-lapped was prepared. The lattice constant of the $SrTiO_3$ monocrystal plate was 3.903 angstroms. This $SrTiO_3$ monocrystal plate was employed as a substrate and the aforementioned 30PZN-23PMN-18PST-29PT was superimposed on the substrate.

The difference in lattice constant between the ceramic sintered body manufactured in this Example and the seed monocrystal was 3.3%. This seed monocrystal and the ceramic sintered body were employed for manufacturing an oxide monocrystal as explained below.

First of all, the mirror-lapped surface of the seed monocrystal was contacted with the mirror-lapped surface of the hot-pressed sintered body sample, thus forming a laminated body, which was then placed in a platinum crucible and several sheets of hot-pressed sintered body made of the same material as the hot-pressed sintered body sample were placed on the hot-pressed sintered body sample as a weight. After being hermetically closed, the platinum crucible was further placed in a magnesia crucible, which was then subjected to a heat treatment in an electric furnace at a temperature of 1280° C. for 170 hours. Upon being cooled, the magnesia crucible was taken out of the electric furnace and the cut surface of the hot-pressed sintered body sample was observed. As a result, grain boundary was not found at all, thus confirming the monocrystallization of the hot-pressed sintered body sample.

A square plate measuring 12 mm×12 mm×0.4 mm was cut out from the newly mono-crystallized portion of the heat-treated body, which was then examined by means of the Laue X-ray method, confirming the monocrystallization of the hot-pressed sintered body sample. Then, 10 sheets of square plate having the same size as mentioned above were cut out from the mono-crystallized portion of the heat-treated body, and a Ni-Au electrode was formed on the both surfaces of the square plate by means of a sputtering method. These square plates were subjected to a polarization treatment in silicone oil heated to 220° C. by applying an electric field of 2 kV/mm, and then cooled down to room temperature. As a result, no crack was recognized in any of 10 sheets of the resultant vibrators polarized as explained above.

The vibrator thus obtained was cut by making use of a diamond blade, thus forming a rectangular element having a width of 150 μm, whose electromechanical coupling coefficient $k_{33'}$ was then measured. As a result, $k_{33'}$ was found to be 81%, and the fluctuation of the value was as small as not more than 2.5%.

In Examples 2 and 3, the ceramic sintered body and the seed monocrystal, both being constituted by a material of the same composition, were employed for forming a monocrystal according to this invention, and in Example 4, a $SrTiO_3$ seed crystal of perovskite structure was employed. However, this invention is not confined to these examples.

For instance, when a MgO monocrystal having a lattice constant of 4.20 angstroms was employed as a seed crystal, and $Pb(Mg_{1/3}Nb_{2/3})O_3$ having a lattice constant of 4.041 angstroms was employed as a ceramic material to perform the monocrystallization by heat-treating them in a closed vessel, it was possible to achieve the monocrystallization in the same manner as explained above.

By contrast, when the PMN (4.04 angstroms) or the PSN (4.08 angstroms) was manufactured in the same manner as explained above except that $TiO_2$ A face (4.59 angstroms) was employed as a seed crystal, the resultant oxide obtained after heat-treatment was of polycrystalline and the generation of cracks was recognized. In this case, the difference in lattice constant between the seed monocrystal and each of the ceramic sintered bodies was 13.6% and 11.1% respectively.

It can be seen from these results that if the difference in lattice constant between a seed monocrystal and a ceramic sintered body exceeds over 10%, it is impossible, with the employment of such a combination of seed monocrystal and a ceramic sintered body, to obtain an oxide monocrystal, and at the same time cracks would be generated in the resultant monocrystal.

Next, a second method of manufacturing an oxide monocrystal according to this invention will be explained.

Namely, this second method of manufacturing an oxide monocrystal comprises the steps of;

covering an oxide seed crystal constituted by a composite perovskite compound represented by the following general formula (1) with ceramic powder constituted by the same elements as those of said oxide seed crystal, and press-molding the resultant structure to form a composite body; and heating the composite body in a closed vessel filled with a lead atmosphere at a temperature of 1,000 to 1,450° C.:

$$Pb\{(B1B2)_{1-x}Ti_x\}O_3 \qquad (1)$$

wherein x is a value ranging from 0 to 0.55, B1 denotes at least one element selected from the group consisting of Zn, Mg, Ni, Sc, In and Yb; and B2 is at least one element selected from the group consisting of Nb and Ta.

The oxide monocrystal can be manufactured as follows.

First of all, as starting materials, PbO, MgO, NiO, $Sc_2O_3$, $In_2O_3$, ZnO, $Ta_2O_5$, $Yb_2O_5$, $Nb_2O_5$ and $TiO_2$ powders, each being high in chemical purity, are prepared and then mixed in such a ratio as to obtain the composition represented by a formula $Pb\{(B1B2)_{1-x}Ti_x\}O_3$. If fpgrequired, a PbO—$B_2O_3$-based flux may be added to the composition. After the resultant mixed powder is fully mixed in a dry type mixer, it is placed in a rubber vessel to perform a rubber-press with a desired pressure to form a solid body, a portion of which is then placed in a platinum container and heated to melt it.

Subsequently, the molten material is cooled in the container, and the residual portion of the solid body is placed in the platinum container. After the platinum container is closed with a platinum cap, the container is disposed at the center of an electric furnace. Thereafter, the furnace is heated up to 1,000 to 1,400° C., then gradually cooled down to 800° C. at a desired cooling rate, and allowed to be cooled down to room temperature. During this cooling step, oxygen gas was selectively blown against one lower portion of the platinum container so as to cause the generation of nucleus to occur at one point.

Subsequently, nitric acid of desired concentration is added to the platinum container and the contents in the platinum container were boiled for a desired period of time to obtain a monocrystal of the perovskite compound represented by the aforementioned general formula (1).

Thereafter, a desired axis of the monocrystal (such as [001] axis) is detected by making use of a Laue X-ray camera and the monocrystal is cut in perpendicular to this axis with a cutter to obtain a prismatic piece of desired size. The cut face of the prismatic piece is then mirrorr-lapped to prepare a seed crystal. Additionally, a spherical seed crystal of desired dimension is manufactured from the monocrystal by making use of a spherical surface-polishing machine.

Figure 6A:
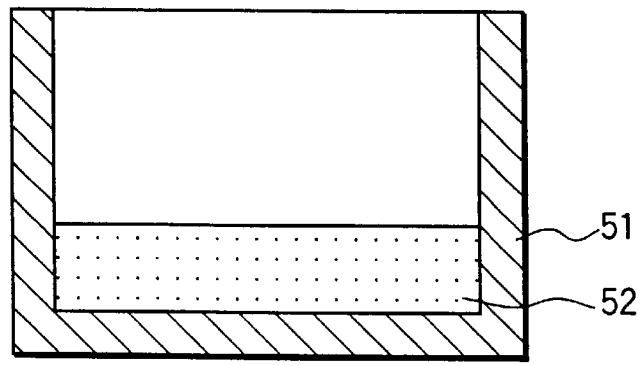
FIGS. 6A to 6C are cross-sectional views illustrating the process for obtaining a ceramic molded body wherein a seed crystal is disposed at the center thereof in the manufacturing an oxide monocrystal according to this invention.
Figure 6B:
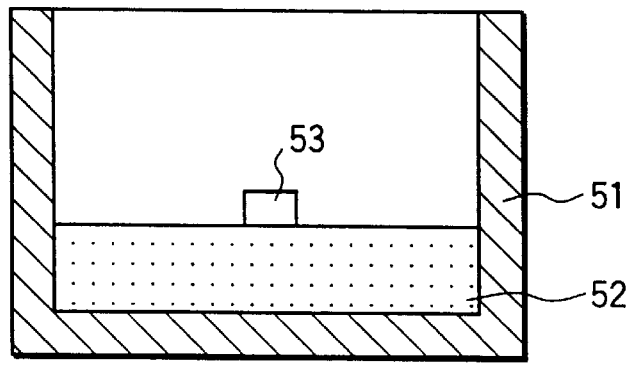
Figure 6C:
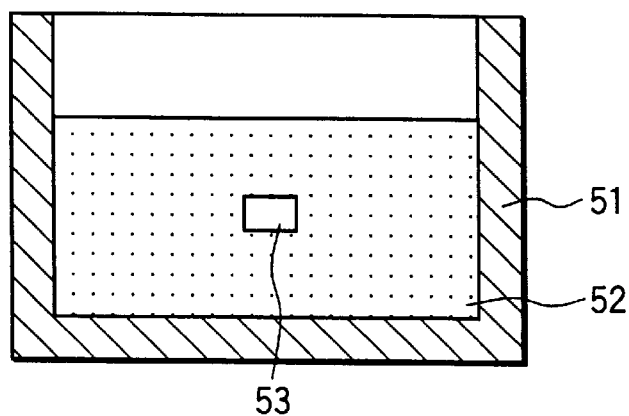

A ceramic powder consisting of the same elements as those of the seed crystal is filled in a mold 51 shown in FIG. 6A and slightly molded to manufacture a ceramic molded product 52. Then, as shown in FIG. 6B, the seed crystal 53 which has been manufactured according to the aforementioned method is placed at the center of the ceramic molded product 52 in the mold 51. Thereafter, as shown in FIG. 6C, a ceramic powder consisting of the same elements as those of the seed crystal is charged over the ceramic molded product 52 as well as over the seed crystal 53, and the resultant structure is molded to obtain a molded product. As a result, a molded product 54 wherein the seed crystal 53 is disposed at the center and entirely enclosed by ceramic powder can be obtained.

Although the seed crystal 53 is entirely enclosed by ceramic powder in the above example, any one of the surfaces of the seed crystal 53 may be exposed out of the ceramic powder.

The molded body carrying the seed crystal at the center thereof is then taken out of the mold and placed in a rubber vessel. Then, the molded body is subjected to a hydrostatic pressing treatment with a pressure of 1,000 to 2,000 kg/cm² for instance to obtain a molded product. The molded product is introduced into a container and, after the container is hermetically sealed with a cap, the molded product is heat-treated at a high temperature in a lead atmosphere, thereby causing the ceramics surrounding the seed crystal to take place a solid-phase growth, i.e. monocrystallization whereby manufacturing an oxide monocrystal. By the way, if any one of the faces of the seed crystal is exposed out of the ceramic powder instead of completely enclosing the seed crystal with the ceramic powder, the solid-phase growth of the ceramics can be orientated to any desired direction, thereby effecting the monocrystallization of the ceramics.

The aforementioned ceramics should preferably be formed of the same elements as those of said oxide seed crystal, in particular formed of a composite perovskite compound represented by the general formula (1) shown below.

$$Pb\{(B1B2)_{1-x}Ti_x\}O_3 \quad (1)$$

wherein x is a value ranging from 0 to 0.55, B1 denotes at least one element selected from the group consisting of Zn, Mg, Ni, Sc, In and Yb; and B2 is at least one element selected from the group consisting of Nb and Ta.

If the value of "x" exceeds over 0.55 in the aforementioned general formula (1) constituting the composite perovskite compound to be used as a seed crystal as well as ceramics, the resultant oxide monocrystal may be easily cracked as it is subjected to a polarization treatment due to a lowering of the insulation resistance thereof. By the way, Ti is not an essential component in this composite perovskite compound. If B1 and B2 are selected from elements defined above, it would be possible to obtain a monocrystalline material exhibiting an excellent piezoelectric characteristics superior than the PZT ceramics.

As for the ceramics, if it is formed of a perovskite compound represented by the aforementioned general formula (1) and if the compound is represented by $ABO_3$ (A; Pb, B; $(B1B2)_{1-x}Ti_x$), the ratio between A-site and B-site, i.e. (A/B) should preferably be in the range of 1.00 to 1.10. If (A/B) ratio is less than 1.00, the growth rate of the monocrystal becomes too slow, making it unpractical. On the other hand, if (A/B) ratio exceeds over 1.10, a superfluous amount of lead oxide constituting the A-site may tend to be entrapped in the interior of the monocrystal. Furthermore, the excessive amount of lead oxide may be supplied from the supply source of lead oxide such as lead zirconate placed in the interior of the closed vessel.

This composite perovskite compound should preferably be constituted by such a composition as explained with reference to the aforementioned first method of manufacturing the monocrystal. This composite perovskite compound may contain the same kinds of element in the same ratio as explained with reference to the aforementioned first method of manufacturing the monocrystal.

The size of the seed monocrystal may be suitably selected depending on the size of ceramic molded body. Even if the size of the seed monocrystal is much smaller as compared with the ceramic molded body, it is possible to realize the monocrystallization of the entire ceramics. Namely, the size of the seed monocrystal may be at least 2 mm or more. At least one of the smooth surfaces of the seed monocrystal should preferably have a smoothness of ±1.0 μm or so. Such a smoothness can be realized by the aforementioned mirror-lapping treatment.

The size of the molded body carrying the seed monocrystal therein may be suitably selected depending on the applications of the monocrystal. For instance, in the case of a medical ultrasonic probe, the size may be 15 mm×(15 to 70 mm)×(0.5 to 10 mm).

The molded body should preferably be sintered after the molding step and before the heat treatment by a hot hydrostatic press (HIP) or by a hot press. This sintering should preferably be performed at a temperature of 1,100 to 1,300° C. under a desired pressure (50 to 300 kg/cm²). It is possible with the employment of this sintering step to easily obtain a sintered body having a sintered density of 99% or more based on the theoretical density, and at the same time to improve the adhesion between the seed crystal and the ceramics, thus enhancing the solid-phase reaction rate for monocrystallization.

When the molded body is to be sintered in prior to the heat treatment as mentioned above, the seed monocrystal should preferably be selected from those having a lattice constant which is preferably equivalent to that of the ceramic sintered body with a deviation, if any, being limited to within ±10%.

It is possible in the manufacture of the molded product or molded body to incorporate an organic binder in the ceramics. When such an organic binder is incorporated in the ceramics, a treatment to burn out the binder in the air atmosphere should preferably be performed prior to the heat treatment for monocrystallization.

The container and cap to be employed should preferably be formed of platinum, palladium, rhodium, silver or an alloy of them, or formed of a porcelain sagger of high density. The employment of these materials is desirable in view of preventing the cracks in the resultant oxide monocrystal.

The reasons for limiting the temperature of heat treatment for monocrystallization are as follows. Namely, if the heat treatment temperature is lower than 1,000° C., the rate of monocrystallization would be extremely decreased. On the other hand, if the heat treatment temperature exceeds over 1,450° C., it would become very difficult to manufacture a large and homogeneous oxide monocrystal. More preferable range of the heat treatment temperature is from 1,050° C. to 1,300° C.

The heating time in the heat treatment may be suitably selected depending for instance on the shape of the molded body (or a sintered body) or on the heating temperature. For example, if the thickness of the molded body (or a sintered body) is 10 mm or less, the heating time may be in the range of 10 to 1,000 hours, more preferably in the range of 100 to 400 hours.

The lead atmosphere in the sealed container can be formed from lead to be released from the molded body (or a sintered body) or from a lead source such as lead zirconate placed in advance in the interior of the closed vessel.

As explained above, it is possible according to the second method of this invention is to manufacture an oxide monocrystal represented by $Pb\{(B1B2)_{1-x}Ti_x\}O_3$, which is free from the generation of cracks or the entrapment of foreign matters such as flux in the interior of the monocrystal, and also free from the generation of cracks in a vibrator to be produced from the monocrystal even after the polarization treatment thereof.

As mentioned above, according to this second method of manufacturing an oxide monocrystal, an oxide seed crystal (which is constituted by a composite perovskite compound represented by $Pb\{(B1B2)_{1-x}Ti_x\}O_3$) is covered by a ceramic powder constituted by the same elements as those of said oxide seed crystal, and then press-molded. As a result, a molded body comprising the seed crystal whose surface is enclosed and closely contacted by ceramics can be obtained. The composite body is then heat-treated in a closed vessel filled with a lead atmosphere at a temperature of 1,000 to 1,450° C. As a result, the solid-phase crystallization reaction of the ceramics takes place isotropically originating from the seed crystal functioning as a nucleus and enclosed by the ceramics.

As explained above, when the composite perovskite compound is represented by $ABO_3$ (A; Pb, B; $(B1B2)_{1-x}Ti_x$) and when the ratio between A-site and B-site, i.e. (A/B) is in the range of more than 1.00 and not larger than 1.10, an excessive amount of Pb is released into the interior of the sealed container. The solid-phase crystallization reaction of the composite perovskite compound represented by $Pb\{(B1B2)_{1-x}Ti_x\}O_3$ proceeds through a phase change thereof to the liquid phase at the interface between the seed crystal and the surrounding ceramics, and at the same time a fluctuation in composition of crystal would take place due to the evaporation of Pb.

As mentioned above, the molded body is constituted by a structure wherein the seed crystal disposed at the center portion is closely contacted with the surrounding ceramics, and, under such a condition, the molded body is charged and heated in a sealed container filled with a lead atmosphere. Accordingly, the solid-phase crystallization reaction would proceed smoothly and there is little possibility that cracks or foreign matters such as flux would be entrapped in the interior of the crystal to be obtained, thus making it possible to manufacture a large oxide monocrystal of excellent quality.

Further, since the molded body is sintered prior to the heat treatment (monocrystallization treatment) by a hot hydrostatic press (HIP) or by a hot press, it is possible to obtain a sintered body of ceramics having a high density and exhibiting an improved adhesion to the seed crystal. Therefore, it is possible to enhance the solid-phase crystallization reaction rate with the seed crystal functioning as a nucleus and to manufacture an oxide monocrystal of homogeneous quality.

A monocrystal of any desired shape or form can be cut out from the oxide monocrystal thus obtained and can be made into a vibrator having an excellent electromechanical coupling coefficient by following the same procedures as explained with reference to the aforementioned first method.

Next, the method for manufacturing an ultrasonic probe according to this invention will be explained with reference to FIG. 1.

First of all, an oxide monocrystal obtained by the aforementioned method is cut in a direction perpendicular to the [001] axis (or C-axis) of the monocrystal, and a conductive film is deposited on the (001) plane of the monocrystal by means of sputtering. Then, the conductive film is selectively etched to leave a conductive film on an ultrasonic wave-transmitting/receiving face of the monocrystal as well as on a surface opposite to the transmitting/receiving face. Then, a dc voltage is applied to the conductive film thereby performing a polarization treatment of the monocrystal plate interposed between a couple of the conductive films. Subsequently, an acoustic matching layer is formed on the transmitting/receiving face of the monocrystal plate, and the resultant monocrystal plate is adhered on a backing material.

Thereafter, the monocrystal plate is cut into plural pieces from the side of the acoustic matching layer by making use of a blade, thereby forming on the backing material a plurality of piezoelectric bodies separated from each other and having a first electrode and a second electrode, and at the same time forming a plurality of acoustic matching layers each disposed on each piezoelectric body. After an acoustic lens is formed on the acoustic matching layers, a flexible printed wiring board is connected with the first electrodes and an earth electrode board is connected with the second electrodes by means of soldering for instance. Finally, a plurality of lead wires (cables) are connected with each of the flexible printed wiring board and the earth electrode board, thereby manufacturing an ultrasonic probe.

Through these processes, an ultrasonic probe shown in FIG. 1 can be obtained.

It is possible, according to this second method of this invention, to manufacture with a high yield an ultrasonic probe which is free from cracks of a piezoelectric body (or an oxide monocrystal) in the polarization treatment and excellent in piezoelectric property which is inherent to a piezoelectric material. Namely, as in the case of the first method of this invention, the ultrasonic probe prepared according to this second method of this invention is excellent in electromechanical coupling coefficient and in matching with a transmitting/receiving circuit, and which enables to minimize a loss due to the cable or the floating capacity of apparatus, thus making it possible to obtain a signal in high sensitivity.

Followings are detailed explanation on the specific examples of the second method of manufacturing an oxide monocrystal according to this invention.

EXAMPLE 5

Preparation of Seed Crystal

First of all, as starting materials, PbO, MgO, $Nb_2O_5$ and $TiO_2$ powders, each being high in chemical purity, were prepared and then mixed in such a ratio as to obtain the composition represented by a formula $Pb\{(Mg_{1/3}Nb_{2/3})_{0.68}Ti_{0.32}\}O_3$ (PMNT; 68/32). Then, an equimolar weight of a $PbO-B_2O_3$-based flux was added to the composition. After the resultant mixed powder was fully mixed in a dry type mixer, it was placed in a rubber vessel to perform a rubber-press with a pressure of 2 tons/cm² to form a solid body, a portion (i.e. 600 g) of which was then placed in a platinum container having a diameter of 50 mm and a volumetric capacity of 250 cm³, and then heated up to 900° C. over 4 hours thereby to melt the solid body.

Subsequently, the molten material was cooled in the container, and the residual portion (i.e. 400 g) of the solid body was placed in the platinum container. After the platinum container was closed with a platinum cap, the container was disposed at the center of an electric furnace. Thereafter, the furnace was heated up to 1200° C. over 12 hours, then gradually cooled down to 800° C. at a cooling rate of 1° C./hr, and allowed to be cooled down to room temperature. During this cooling step, oxygen gas was selectively blown against one lower portion of the platinum container so as to cause the generation of nucleus to occur at one point.

Subsequently, 30% conc. nitric acid was added to the platinum container and the contents in the platinum container were boiled for 8 hours to take out a solid solution type monocrystal from the platinum container. The resultant monocrystal was of an arrowhead-like shape, measuring about 20 mm square.

A portion of the monocrystal was then taken out and pulverized to investigate the crystal structure by means of X-ray diffraction, confirming the formation of perfect perovskite structure. When the composition of this powder was analyzed by means of the ICP, the composition was found to be $Pb\{(Mg_{1/3}Nb_{2/3})_{0.67}Ti_{0.33}\}O_3$. Thereafter, the [001] axis of the monocrystal was detected by making use of a Laue x-ray camera and the monocrystal was cut in perpendicular to the [001] axis with a cutter thereby to obtain a cubic body (3 mm×3 mm×3 mm). All faces of this cubic body was then mirrorr-lapped to manufacture a seed crystal.

Manufacture of Oxide Monocrystal

First of all, as starting materials, PbO, MgO, $Nb_2O_5$ and $TiO_2$ powders, each being high in chemical purity, were employed and mixed in such a ratio as to obtain the composition of $Pb\{(Mg_{1/3}Nb_{2/3})_{0.68}Ti_{0.32}\}O_3$. After being added with pure water, the mixed powder was further mixed and pulverized for 20 hours in a nylon pot mill filled with zirconia balls. Subsequently, the resultant pulverized powder was dried and calcinated in an alumina sagger at a temperature of 800° C.

Thereafter, to this calcinated powder was added lead oxide at a ratio of 3% by weight, and pure water was again added to this calcinated powdery mixture. The resultant mixture was then pulverized in the aforementioned pot mill and subsequently dried to obtain a powdery mixture. Then, a 5% aqueous solution of PVA as an organic binder was added to the powdery mixture at a ratio of 5% by weight, and the resultant mixture was mixed in a mortar. The mixture was then passed through a sieve of #48 to granulate the mixture thereby obtaining granulates, which were then compressed in a mold 30 mm in diameter under a pressure of 5 MPa to provisionally mold them into a plate having a thickness of 10 mm. Then, the aforementioned seed crystal was placed on the central portion of this molded body, and the granulates obtained above were poured over the seed crystal. The resultant composition was pressed again with a pressure of 100 MPa thereby to manufacture a molded product having a thickness of 20 mm.

The molded product was taken out of the mold and then placed into a rubber bag and pressed using a hydrostatic press under a pressure of 200 MPa to obtain a molded body, which was subsequently heated in the air atmosphere at a temperature of 600° C. for 10 hours thereby to burn out the binder. After this burn out step, the molded body was hot-pressed at a temperature of 1,200° C. under a pressure of 10 MPa for 2 hours to obtain a sintered body.

When the features of the resultant sintered body was examined, it was found that the density thereof was 99.5% of theoretical density, that the sintered body was constituted by a single phase of perfect perovskite structure.

Then, the sintered body was placed in a platinum crucible 100 cm³ in capacity and the platinum crucible was hermetically closed with a platinum cap by means of welding. By the way, the platinum cap was provided with a vent hole 0.1 mm in inner diameter. The crucible was then charged in an alumina vessel having a capacity of 500 cm³ and closed with a cap. Then, the alumina vessel was placed at the central portion of the interior of an electric furnace and heated at a temperature of 1,200° C. for 240 hours. Thereafter, the interior of the furnace was cooled down to room temperature at a cooling rate of 100° C./hr. After being cooled in this manner, the sintered body in the crucible was taken out therefrom, and the section of the sintered body was observed. As a result, the grain boundary was not substantially recognized in the section of the sintered body, thus confirming the monocrystallization of the sintered body.

A rectangular plate measuring 12 mm×12 mm×0.4 mm was cut out from this heat-treated sintered body and then examined by means of the Laue X-ray method, thus confirming the monocrystallization of the sintered body. Then, 10 sheets of square plate having the same size as mentioned above were cut out from the heat-treated sintered body, and a Ni-Au electrode was formed on the both surfaces of the square plate. These square plates were subjected to a polarization treatment in silicone oil heated to 180° C. by applying an electric field of 1.0 kV/mm, and then cooled down to room temperature while maintaining the application of the voltage. As a result, no crack was recognized in any of 10 sheets of the resultant vibrator polarized as explained above.

The vibrator thus obtained was cut by making use of a diamond blade, thus forming a rectangular element having a width of 150 μm, whose electromechanical coupling coefficient $k_{33}$, was then measured. As a result, $k_{33}$, was found to be 83%, and the fluctuation of the value was as small as not more than 2%.

Further, an array type ultrasonic probe shown in FIG. 1 was manufactured by making use of the aforementioned monocrystal. Namely, the monocrystal was worked to manufacture a square plate having a main surface constituted by the (001) plane and having a thickness of 200 μm. A Ti/Au conductive film was deposited on the top and bottom surfaces as well as on the side surfaces of the square plate by means of sputtering method. Thereafter, the portion of the conductive film that had been formed on one side surface of the square plate as well as a portion of the conductive film that had been formed on the surface which was opposite to the transmitting/receiving face were selectively etched. Subsequently, a dc voltage of 1.0 kV/mm was applied to the conductive film at a temperature of 180° C. and then cooled down to room temperature thereby performing a polarization treatment of the monocrystal plate. Then, an acoustic matching layer was formed on the transmitting/receiving face of the monocrystal square plate, and the resultant square plate was adhered on a backing material 2.

Thereafter, the square plate was cut into plural strips 120 μm in pitch from the side of the acoustic matching layer by making use of a diamond blade having a thickness of 30 μm. As a result, a plurality of piezoelectric bodies 1 separated from each other and each provided with a first electrode 3 and a second electrode 4 were formed on the backing material 2, and at the same time a plurality of acoustic matching layers 5 each disposed on each piezoelectric body 1 were formed. After an acoustic lens 6 was formed on the acoustic matching layers 5, a flexible printed wiring board 7 was connected with the first electrodes 3 by means of soldering. Further, an earth electrode board 8 was connected with the second electrodes 4 by means of soldering. Finally, a plurality of lead wires (cables) 110 pF/m and 2 m in length were connected with each of the flexible printed wiring board 7 and the earth electrode board 8, thereby manufacturing an array type ultrasonic probe as shown in FIG. 1.

When a reflection echo was measured on this ultrasonic probe by means of a pulse echo method, an echo having a center frequency falling within 4.0 MHz was received from every elements. The sensitivity of the ultrasonic probe was found to be higher the conventional ceramics by 6 dB and the specific zone thereof was found to be as wide as 85%.

EXAMPLE 6

Preparation of Seed Crystal

First of all, as starting materials, PbO, $Sc_2O_3$, MgO, $Nb_2O_5$ and $TiO_2$ powders, each being high in chemical purity (99.9% or more), were prepared and then mixed in such a ratio as to obtain the composition represented by a formula $Pb\{(Sc_{1/2}Nb_{1/2})_{0.29}(Mg_{1/3}Nb_{2/3})_{0.34}Ti_{0.37}\}O_3$ (PSMNT 29/34/37). To this mixture was further added $PbO$—$B_2O_3$ as a flux in an amount two times as much as the molar weight of the composition. After the resultant mixed powder was fully mixed in a dry type mixer, it was placed in a rubber vessel to perform a rubber-press with a pressure of 2 tons/cm$^2$ to form a solid body, a portion (i.e. 600 g) of which was then placed in a platinum container having a diameter of 50 mm and a volumetric capacity of 250 cm$^3$, and then heated up to 900° C. over 4 hours thereby to melt the solid body.

Subsequently, the molten material was cooled in the container, and the residual portion (i.e. 400 g) of the solid body was placed in the platinum container. After the platinum container was closed with a platinum cap, the container was disposed at the center of an electric furnace. Thereafter, the furnace was heated up to 1250° C. over 12 hours, then gradually cooled down to 800° C. at a cooling rate of 1° C./hr, and allowed to be cooled down to room temperature. During this cooling step, oxygen gas was selectively blown against one lower portion of the platinum container so as to cause the generation of nucleus to occur at one point.

Subsequently, 30% conc. nitric acid was added to the platinum container and the contents in the platinum container were boiled for 8 hours to take out a solid solution type monocrystal from the platinum container. The resultant monocrystal was of an arrowhead-like shape, measuring about 20 mm square.

A portion of the monocrystal was then taken out and pulverized to investigate the crystal structure by means of X-ray diffraction, confirming the formation of complete perovskite structure. When the composition of this powder was analyzed by means of the ICP, the values of components were found to be identical with those charged in the beginning. Thereafter, the [001] axis of the monocrystal was detected by making use of a Laue X-ray camera and the monocrystal was cut in perpendicular to the [001] axis with a cutter thereby to obtain a cubic body (3 mm×3 mm×3 mm). All faces of this cubic body was then mirrorr-lapped to manufacture a seed crystal.

Manufacture of Oxide Monocrystal

First of all, as starting materials, PbO, $Sc_2O_3$, MgO, $Nb_2O_5$ and $TiO_2$ powders, each being high in chemical purity, were employed and mixed in such a ratio as to obtain the composition of $Pb\{(Sc_{1/2}Nb_{1/2})_{0.29}(Mg_{1/3}Nb_{2/3})_{0.34}Ti_{0.37}\}O_3$. After being added with pure water, the mixed powder was further mixed and pulverized for 20 hours in a nylon pot mill filled with zirconia balls. Subsequently, the resultant pulverized powder was dried and calcinated in an alumina sagger at a temperature of 800° C.

Thereafter, to this calcinated powder was added lead oxide at a ratio of 3% by weight, and pure water was again added to this calcinated powdery mixture. The resultant mixture was then pulverized in the aforementioned pot mill and subsequently dried to obtain a powdery mixture. Then, a 5% aqueous solution of PVA as an organic binder was added to the powdery mixture at a ratio of 5% by weight, and the resultant mixture was mixed in a mortar. The mixture was then passed through a sieve of #48 to granulate the mixture thereby obtaining granulates, which were then compressed in a mold 30 mm in diameter under a pressure of 5 MPa to provisionally mold them into a plate having a thickness of 10 mm. Then, the aforementioned seed crystal was placed on the central portion of this molded body, and the granulates obtained above were poured over the seed crystal. The resultant composition was pressed again with a pressure of 100 MPa thereby to manufacture a molded product having a thickness of 20 mm.

The molded product was taken out of the mold and then placed into a rubber bag and pressed using a hydrostatic press under a pressure of 200 MPa to obtain a molded body, which was subsequently heated in the air atmosphere at a temperature of 600° C. for 10 hours thereby to burn out the binder. After this burn out step, the molded body was hot-pressed at a temperature of 1,200° C. under a pressure of 10 MPa for 2 hours to obtain a sintered body.

When the features of the resultant sintered body was examined, it was found that the density thereof was 99.5% of theoretical density, that the sintered body was constituted by a single phase of perfect perovskite structure.

Then, the sintered body was placed in a platinum crucible 100 cm$^3$ in capacity and the platinum crucible was hermetically closed with a platinum cap by means of welding. By the way, the platinum cap was provided with a vent hole 0.1 mm in inner diameter. The crucible was then charged in an alumina vessel having a capacity of 500 cm$^3$ and closed with a cap. Then, the alumina vessel was placed at the central portion of the interior of an electric furnace and heated at a temperature of 1,200° C. for 240 hours. Thereafter, the interior of the furnace was cooled down to room temperature at a cooling rate of 100° C./hr. After being cooled in this manner, the sintered body in the crucible was taken out therefrom, and the section of the sintered body was observed. As a result, the grain boundary was not substantially recognized in the section of the sintered body, thus confirming the monocrystallization of the sintered body.

A rectangular plate measuring 12 mm×12 mm×0.4 mm was cut out from this heat-treated sintered body and then examined by means of the Laue X-ray method, thus confirming the monocrystallization of the sintered body. Then, 10 sheets of square plate having the same size as mentioned above were cut out from the heat-treated sintered body, and a Ni-Au electrode was formed on the both surfaces of the square plate. These square plates were subjected to a polarization treatment in silicone oil heated to 220° C. by applying an electric field of 2.0 kV/mm, and then cooled down to room temperature while maintaining the application of the voltage. As a result, no crack was recognized in any of 10 sheets of the resultant vibrator polarized as explained above.

The vibrator thus obtained was cut by making use of a diamond blade, thus forming a rectangular element having a width of 150 μm, whose electromechanical coupling coefficient $k_{33'}$ was then measured. As a result, $k_{33'}$ was found to be 82%, and the fluctuation of the value was as small as not more than 2%.

Further, an array type ultrasonic probe shown in FIG. 1 was manufactured by making use of the aforementioned monocrystal. Namely, the monocrystal was worked to manufacture a square plate having a main surface constituted by the (001) plane and having a thickness of 200 µm. A Ti/Au conductive film was deposited on the top and bottom surfaces as well as on the side surfaces of the square plate by means of sputtering method. Thereafter, the portion of the conductive film that had been formed on one side surface of the square plate as well as a portion of the conductive film that had been formed on the surface which was opposite to the transmitting/receiving face were selectively etched. Subsequently, a dc voltage of 1.0 kV/mm was applied to the conductive film at a temperature of 180° C. and then cooled down to room temperature thereby performing a polarization treatment of the monocrystal plate. Then, an acoustic matching layer was formed on the transmitting/receiving face of the monocrystal square plate, and the resultant square plate was adhered on a backing material 2.

Thereafter, the square plate was cut into plural strips 120 µm in pitch from the side of the acoustic matching layer by making use of a diamond blade having a thickness of 30 µm. As a result, a plurality of piezoelectric bodies 1 separated from each other and each provided with a first electrode 3 and a second electrode 4 were formed on the backing material 2, and at the same time a plurality of acoustic matching layers 5 each disposed on each piezoelectric body 1 were formed. After an acoustic lens 6 was formed on the acoustic matching layers 5, a flexible printed wiring board 7 was connected with the first electrodes 3 by means of soldering. Further, an earth electrode board 8 was connected with the second electrodes 4 by means of soldering. Finally, a plurality of lead wires (cables) 110 pF/m and 2 m in length were connected with each of the flexible printed wiring board 7 and the earth electrode board 8, thereby manufacturing an array type ultrasonic probe as shown in FIG. 1.

When a reflection echo was measured on this ultrasonic probe by means of a pulse echo method, an echo having a center frequency falling within 4.0 MHz was received from every elements. The sensitivity of the ultrasonic probe was found to be higher the conventional ceramics by 6 dB and the specific zone thereof was found to be as wide as 85%.

EXAMPLE 7

Preparation of Seed Crystal

First of all, as starting materials, PbO, $Sc_2O_3$, MgO, ZnO, $Nb_2O_5$, $Ta_2O_5$ and $TiO_2$ powders, each being high in chemical purity (99.9% or more), were prepared and then mixed in such a ratio as to obtain the composition represented by a formula $Pb\{(Zn_{1/3}Nb_{2/3})_{0.30}(Mg_{1/3}Nb_{2/3})_{0.23}(Sc_{1/2}Ta_{1/2})_{0.18}Ti_{0.29}\}O_3$ (PZMNSTT; 30/23/18/29). To this mixture was further added PbO—$B_2O_3$ as a flux in an amount two times as much as the molar weight of the composition. After the resultant mixed powder was fully mixed in a dry type mixer, it was subjected to a rubber-press in the same manner as in Example 5 to form a solid body, a portion (i.e. 600 g) of which was then placed in a platinum container having a diameter of 50 mm and a volumetric capacity of 250 cm³, and then heated up to 900° C. over 4 hours thereby to melt the solid body.

Subsequently, the molten material was cooled in the container, and the residual portion (i.e. 400 g) of the solid body was placed in the platinum container. After the platinum container was closed with a platinum cap, the container was disposed at the center of an electric furnace. Thereafter, the furnace was heated up to 1250° C. over 12 hours, then gradually cooled down to 800° C. at a cooling rate of 1° C./hr, and allowed to be cooled down to room temperature. During this cooling step, oxygen gas was selectively blown against one lower portion of the platinum container so as to cause the generation of nucleus to occur at one point.

Subsequently, 30% conc. nitric acid was added to the platinum container and the contents in the platinum container were boiled for 8 hours to take out a solid solution type monocrystal from the platinum container. The resultant monocrystal was of an arrowhead-like shape, measuring about 20 mm square.

A portion of the monocrystal was then taken out and pulverized to investigate the crystal structure by means of X-ray diffraction, confirming the formation of complete perovskite structure. When the composition of this powder was analyzed by means of the ICP, the powder was found to have a composition of $Pb\{(Zn_{1/3}Nb_{2/3})_{0.28}(Mg_{1/3}Nb_{2/3})_{0.25}(Sc_{1/2}Ta_{1/2})_{0.20}Ti_{0.27}\}O_3$. Thereafter, the [001] axis of the monocrystal was detected by making use of a Laue X-ray camera and the monocrystal was cut in perpendicular to the [001] axis with a cutter thereby to obtain a cubic body (3 mm×3 mm×3 mm). All faces of this cubic body was then mirrorr-lapped to manufacture a seed crystal.

Manufacture of Oxide Monocrystal

First of all, as starting materials, PbO, $Sc_2O_3$, MgO, ZnO, $Nb_2O_5$, $Ta_2O_3$ and $TiO_2$ powders, each being high in chemical purity, were employed and mixed in such a ratio as to obtain the composition of $Pb\{(Zn_{1/3}Nb_{2/3})_{0.30}(Mg_{1/3}Nb_{2/3})_{0.23}(Sc_{1/2}Ta_{1/2})_{0.18}Ti_{0.29}\}O_3$. After being added with pure water, the mixed powder was further mixed and pulverized for 20 hours in a nylon pot mill filled with zirconia balls. Subsequently, the resultant pulverized powder was dried and calcinated in an alumina sagger at a temperature of 800° C.

Thereafter, to this calcinated powder was added lead oxide at a ratio of 2% by weight, and pure water was again added to this calcinated powdery mixture. The resultant mixture was then pulverized in the aforementioned pot mill and subsequently dried to obtain a powdery mixture. Then, a 5% aqueous solution of PVA as an organic binder was added to the powdery mixture at a ratio of 5% by weight, and the resultant mixture was mixed in a mortar. The mixture was then passed through a sieve of #48 to granulate the mixture thereby obtaining granulates, which were then compressed in a mold 30 mm in diameter under a pressure of 5 MPa to provisionally mold them into a plate having a thickness of 10 mm. Then, the aforementioned seed crystal was placed on the central portion of this molded body, and the granulates obtained above were poured over the seed crystal. The resultant composition was pressed again with a pressure of 100 MPa thereby to manufacture a molded product having a thickness of 20 mm.

The molded product was taken out of the mold and then placed into a rubber bag and pressed using a hydrostatic press under a pressure of 200 MPa to obtain a molded body, which was subsequently heated in the air atmosphere at a temperature of 600° C. for 10 hours thereby to burn out the binder. After this burn out step, the molded body was hot-pressed at a temperature of 1,200° C. under a pressure of 10 MPa for 2 hours to obtain a sintered body.

When the features of the resultant sintered body was examined, it was found that the density thereof was 99.5% of theoretical density, that the sintered body was constituted by a single phase of perfect perovskite structure.

Then, the sintered body was placed in a platinum crucible 100 cm³ in capacity and the platinum crucible was hermetically closed with a platinum cap by means of welding. By the way, the platinum cap was provided with a vent hole 0.1 mm in inner diameter. The crucible was then charged in an alumina vessel having a capacity of 500 cm$^3$ and closed with a cap. Then, the alumina vessel was placed at the central portion of the interior of an electric furnace and heated at a temperature of 1,250° C. for 240 hours. Thereafter, the interior of the furnace was cooled down to room temperature at a cooling rate of 100° C./hr. After being cooled in this manner, the sintered body in the crucible was taken out therefrom, and the section of the sintered body was observed. As a result, the grain boundary was not substantially recognized in the section of the sintered body, thus confirming the monocrystallization of the sintered body.

A rectangular plate measuring 12 mm×12 mm×0.4 mm was cut out from this heat-treated sintered body and then examined by means of the Laue X-ray method, thus confirming the monocrystallization of the sintered body. Then, 10 sheets of square plate having the same size as mentioned above were cut out from the heat-treated sintered body, and a Ni-Au electrode was formed on the both surfaces of the square plate. These square plates were subjected to a polarization treatment in silicone oil heated to 220° C. by applying an electric field of 1.0 kV/mm, and then cooled down to room temperature while maintaining the application of the voltage. As a result, no crack was recognized in any of 10 sheets of the resultant vibrator polarized as explained above.

The vibrator thus obtained was cut by making use of a diamond blade, thus forming a rectangular element having a width of 150 µm, whose electromechanical coupling coefficient $k_{33'}$ was then measured. As a result, $k_{33'}$ was found to be 81%, and the fluctuation of the value was as small as not more than 2.5%.

Further, an array type ultrasonic probe shown in FIG. 1 was manufactured by making use of the aforementioned monocrystal. Namely, the monocrystal was worked to manufacture a square plate having a main surface constituted by the (001) plane and having a thickness of 200 µm. A Ti/Au conductive film was deposited on the top and bottom surfaces as well as on the side surfaces of the square plate by means of sputtering method. Thereafter, the portion of the conductive film that had been formed on one side surface of the square plate as well as a portion of the conductive film that had been formed on the surface which was opposite to the transmitting/receiving face were selectively etched. Subsequently, a dc voltage of 1.0 kV/mm was applied to the conductive film at a temperature of 180° C. and then cooled down to room temperature thereby performing a polarization treatment of the monocrystal plate. Then, an acoustic matching layer was formed on the transmitting/receiving face of the monocrystal square plate, and the resultant square plate was adhered on a backing material 2.

Thereafter, the square plate was cut into plural strips 120 µm in pitch from the side of the acoustic matching layer by making use of a diamond blade having a thickness of 30 µm. As a result, a plurality of piezoelectric bodies 1 separated from each other and each provided with a first electrode 3 and a second electrode 4 were formed on the backing material 2, and at the same time a plurality of acoustic matching layers 5 each disposed on each piezoelectric body 1 were formed. After an acoustic lens 6 was formed on the acoustic matching layers 5, a flexible printed wiring board 7 was connected with the first electrodes 3 by means of soldering. Further, an earth electrode board 8 was connected with the second electrodes 4 by means of soldering. Finally, a plurality of lead wires (cables) 110 pF/m and 2 m in length were connected with each of the flexible printed wiring board 7 and the earth electrode board 8, thereby manufacturing an array type ultrasonic probe as shown in FIG. 1.

When a reflection echo was measured on this ultrasonic probe by means of a pulse echo method, an echo having a center frequency falling within 4.0 MHz was received from every elements. The sensitivity of the ultrasonic probe was found to be higher the conventional ceramics by 5 dB and the specific zone thereof was found to be as wide as 80%.

When a difference in lattice constant between the seed crystal and the sintered body was more than 10% in the above Examples 5 to 7, the generation of cracks was slightly recognized in the oxide monocrystals obtained.

As apparent from the results described above, it is possible with the employment of the method of this invention to obtain a monocrystal which is free from any cracks and flux inclusion even if the crystal is of large size, and which is capable of exhibiting a stable property even after a polarization treatment.

In the aforementioned examples, (PMNT 68/32), (PSMNT 29/34/37) and (PZMNSTT 30/23/18/29) were exemplified in the explanation of the manufacturing method of this invention. However, this invention is not confined to them, but other similar kinds of piezoelectric monocrystals such as $Pb\{(Sc_{1/2}Nb_{1/2})_{0.58}Ti_{0.42}\}O_3$,
$Pb\{(Sc_{1/2}Ta_{1/2})_{0.55}Ti_{0.45}\}O_3$,
$Pb\{(Yb_{1/2}Nb_{1/2})_{0.50}Ti_{0.50}\}O_3$ or
$Pb\{(In_{1/2}Nb_{1/2})_{0.63}Ti_{0.37}\}O_3$ were found to be useful for obtaining the similar effects.

As explained above, since the electromechanical coupling coefficient and acoustic impedance of a piezoelectric monocrystal to be employed for a composite piezoelectric body are confined respectively to a specific range according to this invention, it is possible to obtain an ultrasonic probe having a remarkable improved sensitivity. Furthermore, since the ultrasonic probe to be obtained according to this invention has a broad band characteristics and at the same time is capable of setting a wide Doppler reference frequency, it would be very effective in improving the diagnostic capability of a medical diagnostic apparatus.

It is also possible according to this invention to provide a method of manufacturing a monocrystal of large size which is free from cracks or flux inclusion and capable of exhibiting a stable characteristics even after the polarization thereof. The monocrystal to be manufactured according to this invention is useful particularly for manufacturing a vibrator for an ultrasonic probe, but may also be useful for other applications such as a non-destructive test equipment, a capacitor, an optical material or any other applications where a monocrystal material can be employed.

Additional advantages and modifications will readily occurs to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed:

1. An ultrasonic probe provided with an ultrasonic wave-transmitting/receiving element comprising:
   a 1-3 type or 2-2 type composite piezoelectric body exposing a piezoelectric monocrystal from at least one of the faces of said composite piezoelectric body; and
   an electrode mounted on said at least one of the faces of the composite piezoelectric body;

wherein said composite piezoelectric body comprises a piezoelectric monocrystal whose electromechanical coupling coefficient ratio $k_{33}/k_t$ is 1.6 or more, and a resin whose acoustic impedance Zp is $4\times10^6$ kg/m²s or less.

2. The ultrasonic probe according to claim 1, wherein at least either said electromechanical coupling coefficient $k_{33}$ or said electromechanical coupling coefficient $k_t$ meets conditions of $k_{33} \geq 80\%$ and $k_t \geq 50\%$.

3. The ultrasonic probe according to claim 2, wherein said acoustic impedance Zp is $1\times10^6$ kg/m²s or more.

4. The ultrasonic probe according to claim 1, wherein said piezoelectric monocrystal is an oxide monocrystal represented by $ABO_3$.

5. The ultrasonic probe according to claim 4, wherein said A is Pb, and said B is represented by $Pb\{(B1B2)_{1-x}Ti_x\}O_3$, wherein B1 denotes at least one element selected from the group consisting of Zn, Mg, Ni, Sc, In and Yb; B2 is at least one element selected from the group consisting of Nb and Ta, and x is a value falling in the range of 0.05 to 0.55.

6. The ultrasonic probe according to claim 5, wherein said oxide monocrystal is produced by using oxide ceramics represented by $ABO_3$ in which a ratio (A/B) between A-site and B-site is in the range of 1.00 to 1.10.

7. The ultrasonic probe according to claim 2, wherein said resin is an epoxy resin.

8. The ultrasonic probe according to claim 2, wherein said electrode is mounted only on said face where said piezoelectric monocrystal is exposed.

* * * * *